United States Patent [19]

Kasai et al.

[11] Patent Number: 5,117,761
[45] Date of Patent: Jun. 2, 1992

[54] PART MOUNTING APPARATUS

[75] Inventors: Shozo Kasai, Kawasaki; Yusaku Azuma; Yasushi Aoki, both of Yokohama; Makoto Akahira, Kawasaki; Takeshi Yakou, Tokyo; Suguru Onuma, Yokohama, all of Japan

[73] Assignee: Canon Kabushiki Kaisha, Tokyo, Japan

[21] Appl. No.: 514,733

[22] Filed: Apr. 26, 1990

[30] Foreign Application Priority Data

Apr. 28, 1989 [JP] Japan .................. 1-107741
May 15, 1989 [JP] Japan .................. 1-118738
Sep. 20, 1989 [JP] Japan .................. 1-241700
Mar. 26, 1990 [JP] Japan .................. 2-73504
Mar. 29, 1990 [JP] Japan .................. 2-81719

[51] Int. Cl.⁵ .............................. A47B 85/00
[52] U.S. Cl. ............................ 108/22; 74/16; 108/20
[58] Field of Search ............. 108/20, 21, 22, 94, 108/140, 143; 79/16, 471 XY

[56] References Cited

U.S. PATENT DOCUMENTS

| 3,155,383 | 11/1964 | Whitmore | 108/20 X |
| 3,224,391 | 12/1965 | Cooper | 108/140 |
| 4,598,635 | 7/1986 | Clegg | 108/20 |
| 4,656,951 | 4/1987 | Kimura et al. | 108/20 |
| 4,896,431 | 1/1990 | Danmoto et al. | |

FOREIGN PATENT DOCUMENTS 59-29493 2/1984 Japan.

Primary Examiner—Peter A. Aschenbrenner
Attorney, Agent, or Firm—Fitzpatrick, Cella, Harper & Scinto

[57] ABSTRACT

A base plate positioning mechanism in an electronic part mounting apparatus wherein a part supplying position and a mounting position are fixed, characterized in that a friction driving mechanism is used in a rotative driving unit for setting the rotated positions of an electronic part and a base plate to predetermined angles in order to adjust the part mounting position of the base plate to the fixed mounting position.

3 Claims, 18 Drawing Sheets

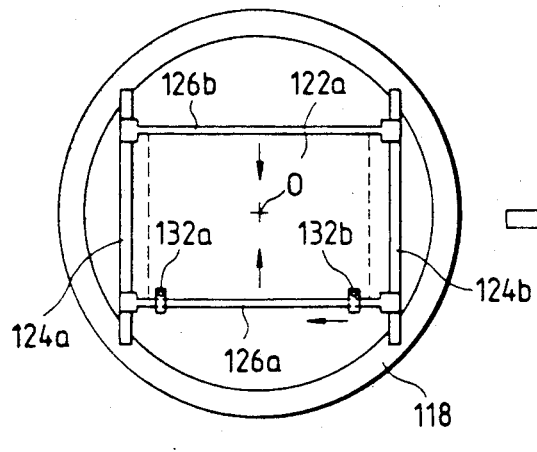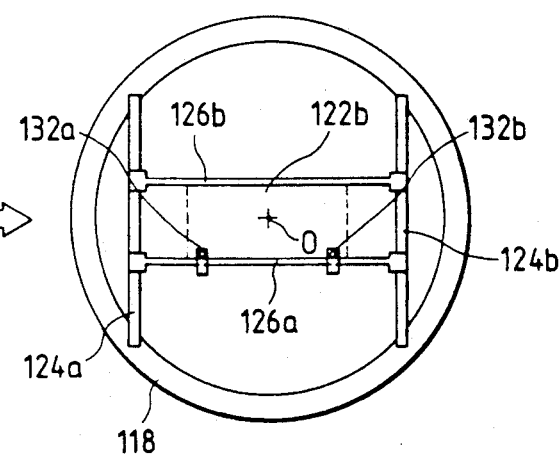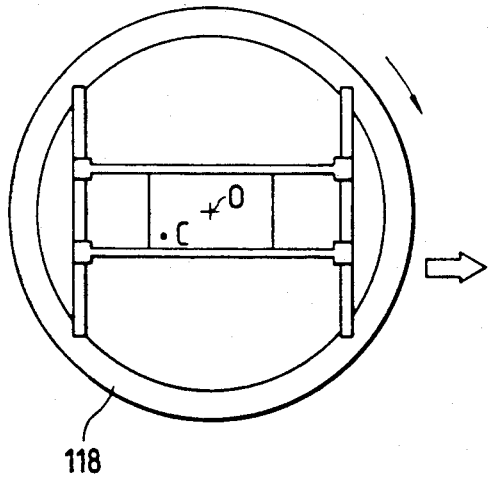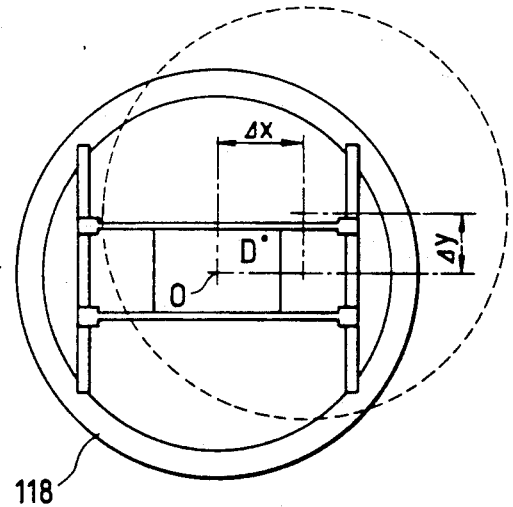

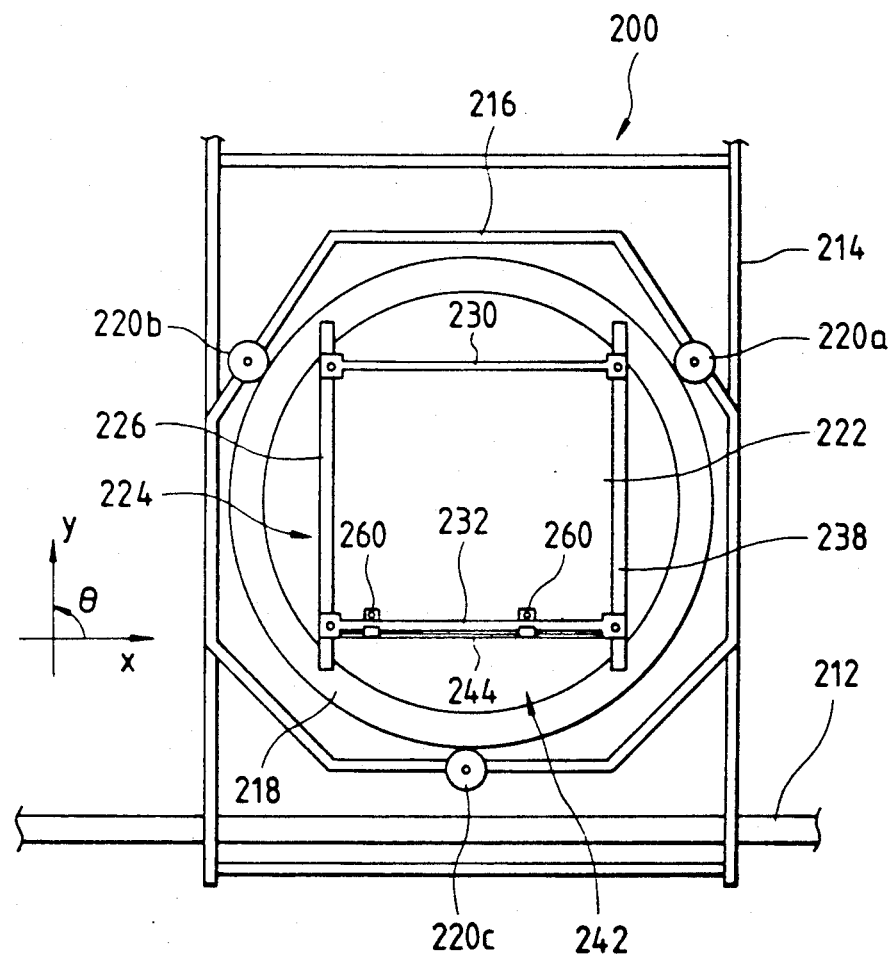

PART MOUNTING APPARATUS

BACKGROUND OF THE INVENTION

1. Field of the Invention

This invention relates to a base plate positioning mechanism in an electronic part mounting machine in which a part supplying position and a mounting position are fixed.

2. Related Background Art

Various electronic part mounting machines in which a part supplying position and a mounting position are fixed have heretofore been developed to achieve a high speed of mounting. In such electronic part mounting machines, a gear and a belt are used for a rotative driving unit for a table for positioning a base plate at a predetermined mounting position.

However, the base plate positioning mechanism according to the prior art using a gear and a belt in the rotative driving unit has suffered from the following disadvantages:

(1) In the mechanism using a gear, it is pointed out that backlash is great and noise is annoying: and (2) In the mechanism using a belt, it is pointed out that the presence of a soft belt between a driving portion and a follower portion leads to the impossibility of rotation at a high speed and the complication of control.

SUMMARY OF THE INVENTION

The present invention has been made in view of the above-noted problems and a first object thereof is to provide a base plate positioning mechanism in an electronic part mounting machine which can be reliably rotatively driven without using a gear or a belt in a rotative driving unit.

An object of the present invention is to eliminate backlash and noise and at the same time enable high-speed rotation of a base plate by using friction driving in the rotative driving unit of a base plate positioning mechanism.

A second object of the present invention is to provide a further improvement in a part mounting apparatus using friction driving means in the rotating mechanism mentioned under the first object.

Further, in this friction driving, there may sometimes occur slip, and if such slip accumulates in conformity with the rotation of the rotating mechanism, the detected angle may deviate from the actual angle.

The present invention has been made in view of the above-noted problem and provides a base plate rotating mechanism in a turret type mounting machine which adopts friction driving in a rotative driving unit and yet in which the detected rotated position may always accurately coincide with the actual rotated position even if slip occurs.

The problem of slip as noted above arises when the rotation of a rotary table is smoothly effected by the above-mentioned rotative friction driving means, and another object of the present invention is to propose means for accurately controlling lock means for locking the rotary table at a predetermined stop position when the rotary table is rotated to near the predetermined position and stopped thereat.

Another object of the present invention is to propose a mounting machine in which when a plurality of parts are to be mounted at predetermined positions on a print circuit board, the amount of rotation of a rotary table for each part is prerecorded in a memory and when the amount of rotation for each part is read out from the memory to thereby control the rotation, the information of an error based on the slip by said rotative friction driving is revised, whereby the rotation for each of the plurality of parts can be accurately accomplished.

A third object of the present invention is to provide a mounting apparatus for electronic parts or the like which does not make the tact time uselessly long even when electronic parts or the like are mounted at any positions on base plates of different sizes.

In the prior art mounting apparatus for electronic parts or the like, a construction shown in FIG. 16 of the accompanying drawings is known as an example of a base plate holding table. In FIG. 16, the reference character a designates a base plate on which electronic parts are mounted, the reference character b denotes a movable x-axis guide, the reference character c designates a fixed x-axis guide, the reference character d denotes a y-axis guide, the reference character e designates a rotatable disk table, the reference character f denotes a disk table driving roller, the reference character q designates a frame, the reference character h denotes a y-direction frame guide, the reference character i designates an x-direction frame guide, the reference character j denotes a fixed positioning pin, and the reference character k designates a movable positioning pin.

In this example of the prior art, when the size of the base plate is changed, as shown in FIG. 17 of the accompanying drawings, the movable x-axis guide b slides and the movable positioning pin k slides, whereby the base plate is set so as to be always positioned in the left downward portion of the figure.

In this case, however, when as shown in FIG. 18 of the accompanying drawings, a part is to be inserted into a point A far from the center of the disk table e and thereafter the part is to be inserted into a point B near the point A with the direction changed by 180°, the disk table e is first rotated by 180° and thereafter is moved along the directions of the x-axis and the y-axis to make the point B coincident with the mounting position, but as shown, the amounts of movement Δx and Δy along the directions of the x-axis and the y-axis are great values and as a result, this has heretofore led to a problem that the disk table must be moved for a long time and the tact time becomes longer.

A fourth object of the present invention is to provide a mounting apparatus which can position base plates of various sizes highly accurately by a simple construction.

Heretofore, in a mounting apparatus for electronic parts or the like, it has been the practice to provide a movable positioning pin to position base plates of various sizes accurately, and an example of such a movable positioning pin is constructed as shown, for example, in FIGS. 19A and 19B of the accompanying drawings. That is, in FIG. 19A, the base plate a on which electronic parts are mounted is sandwiched and held between a movable x-axis guide b and a thin plate c. This base plate a is formed with a positioning hole d, and by being fitted into this positioning hole d from below, the positioning of the base plate a may be accomplished.

That is, this positioning pin e is mounted for sliding movement along the x-axis relative to a support rod f extending along the movable x-axis guide b and is integrally mounted on the fore end of a pin supporting member g set so as to rotate therewith. In this manner, when the size of the base plate a is changed, the pin supporting member q slides to an optimum position along the x-axis and the support rod f is pivotally moved, whereby the positioning pin e may be fitted into the positioning hole d in the base plate a from below.

However, in the mounting apparatus according to the prior art as described above, during the positioning operation, the positioning pin e is fitted into the positioning hole d in response to the pivotal movement of the support rod f, as shown in FIG. 19B, and thus, substantially, the positioning pin is fitted into the positioning hole d from an oblique direction rather than from below. As a result, it becomes impossible to make the clearance of the outer dimensions of the positioning hole d formed in the base plate a and the positioning pin e.

Very high accuracy of positioning is required particularly for the recent minute mounting mode for the base plate a, and the above-mentioned large clearance aggravates the accuracy of positioning and thus, a solution thereto is desired.

Here, as a means for solving the problem of such a large clearance, there has been provided a technique as disclosed, for example, in Japanese Laid-Open Patent Application No. 59-29493 wherein one of a pair of base plate conveying guides opposed to each other on which a print base plate is placed is made movable and said one base plate conveying guide is pressed by pressing means to thereby press the print base plate in the widthwise direction thereof, whereby a positioning pin is pressed against the marginal portion of a base plate positioning hole to thereby absorb any base plate positioning error.

However, in the technique disclosed in this publication, pressing means is separately necessary and thus, a problem of a complicated mechanism newly arises Thus, it is desired that higher accuracy of positioning be achieved by a simpler construction.

BRIEF DESCRIPTION OF THE DRAWINGS

FIGS. 7 to 11B show an example of the improvement in the tact time of the present invention, FIG. 7 being a plan view schematically showing the construction of an embodiment of a mounting apparatus for electronic parts or the like according to the present invention, FIG. 8 being a perspective view showing the detailed construction of a movable x-axis guide shown in FIG. 7, FIG. 9 being a perspective view showing the detailed mounted condition of a movable positioning pin shown in FIG. 7, FIGS. 10A and 10B being plan views showing a method of positioning base plates of different sizes, and FIGS. 11A and 11B being plan views showing the mounted state of an electronic part.

FIG. 12 is a plan view schematically showing the construction of an embodiment of the mounting apparatus according to the present invention.

DESCRIPTION OF THE PREFERRED EMBODIMENTS

The construction of an embodiment of a base plate rotating mechanism in a turret type mounting apparatus according to the present invention will hereinafter be described in detail with reference to the accompanying drawings.

Figure 1:
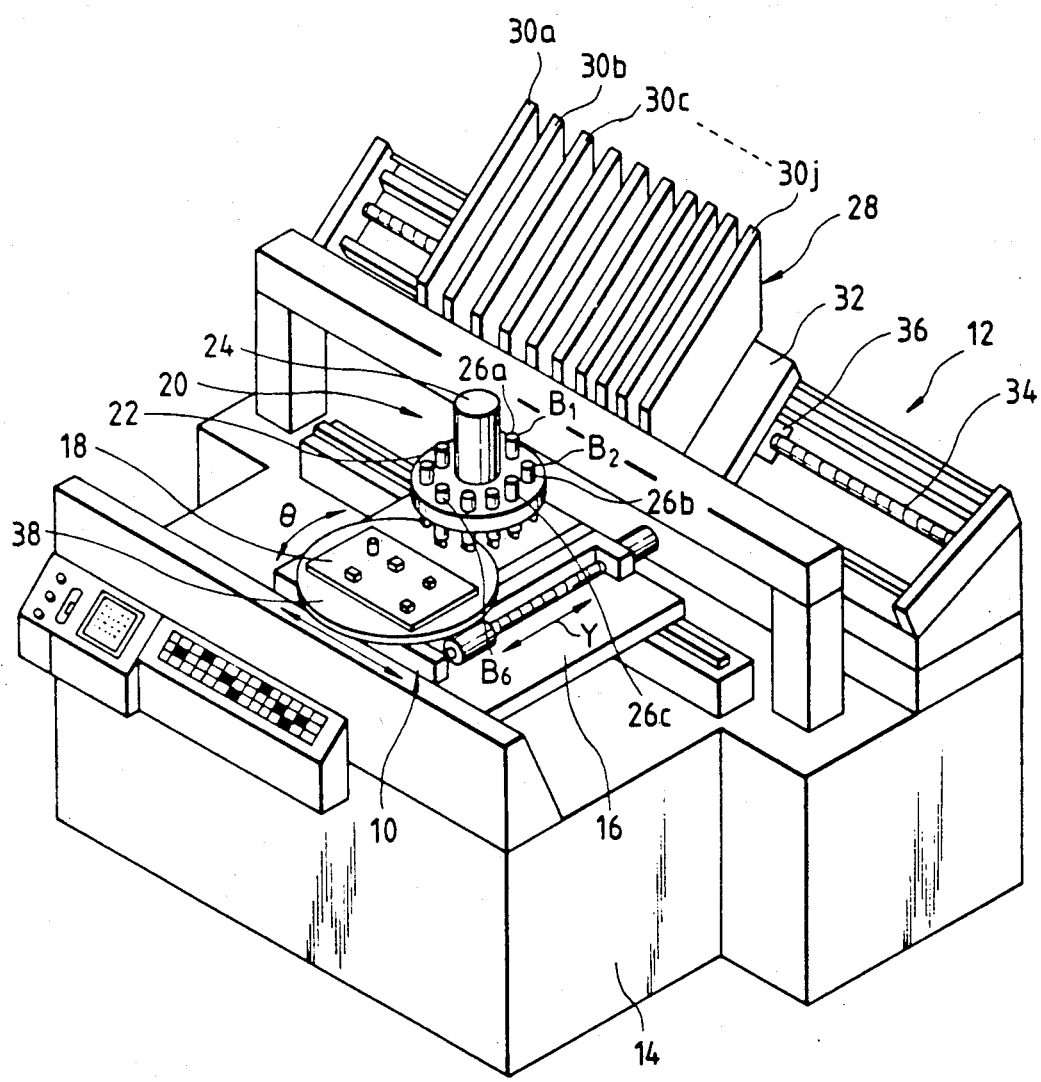
FIG. 1 is a perspective view schematically showing the construction of an embodiment of a base plate rotating mechanism in a turret type mounting apparatus according to the present invention.

FIG. 1 schematically shows a part supplying position in which the base plate rotating mechanism of this embodiment is provided and the construction of an electronic part mounting apparatus 12 (hereinafter simply referred to as the mounting apparatus) fixed at a mounted position.

The outline of this mounting apparatus 12 will first be described with reference to FIG. 1.

This mounting apparatus 12 is provided with a base bed 14 placed on a groundsill, not shown, and a slide bed 16 supported for movement along the direction of the x-axis on the base bed 14. A base plate positioning mechanism 10 on which a base plate 18, on which electronic parts are mounted is placed on the slide bed 16 for movement along the direction of the y-axis and for rotation about its own center axis.

A turret head mechanism 20 is disposed above the base plate positioning mechanism 10. This turret head mechanism 20 is provided with a rotatable turret table 22 which is rotatively driven by a table rotating motor 24 and which is provided with a plurality of (in this embodiment, ten) mounting heads 26a–26j for mounting electronic parts disposed at equal intervals on the marginal edge portion thereof.

In this turret head mechanism 20, the turret table 22 is rotated by the table rotating motor 24 to thereby move the mounting heads 26a-26j, and a part is delivered from a part supplying mechanism 28 which will be described later to the mounting head brought to a part supplying position indicated by the reference character B₁, and by the mounting head brought to a mounting position indicated by the reference character B₆ which is prescribed to a rotated position spaced apart from said part supplying position by 180°, a part is set so as to be mounted at a predetermined position on the base plate 18 positioned by the part positioning mechanism 10.

On the other hand, rearwardly of the turret head mechanism 20, a part supplying mechanism 28 is disposed on the base bed 14. This part supplying mechanism 28 is provided with a plurality of (in this embodiment, ten) part supplying units 30a-30j containing different parts therein, and a unit supporting table 32 on which these part supplying units 30a-30j are placed and which are supported for movement along the direction of the x-axis.

A first nut member 36 threadably engaged with a first ball screw 34 extending along the direction of the x-axis is fixed to one side of the unit supporting table 32, and by the first ball screw 34 being driven by a motor, not shown, the unit supporting table 32 can be moved along the direction of the x-axis to thereby move on of the part supplying units 30a-30j containing predetermined parts therein to a mounted position B₁ on the turret table 22, as desired.

The electronic parts supplied from the part supplying mechanism 28 constructed as described above are mounted at a predetermined position on the base plate 18, and the construction of the base plate positioning mechanism 10 for positioning the base plate 18 will now be described with reference to FIG. 2.

This base plate positioning mechanism 10 is provided with a rotary table 38 on which the base plate 18 is directly placed, for movement along the x-axis and the y-axis relative to the base bed 14 and for rotation about its own center axis. That is, this base plate positioning mechanism 10 is provided with a pair of parallel stands 40a and 40b, fixed onto the base bed 14 and set so as to extend along the direction of the x-axis. On the stand 40a (the upper stand in FIG. 2), an x-axis frame 42 formed into the shape of an elongate frame along the direction of the y-axis is supported for movement along the direction of the x-axis with a first side (the upper side in FIG. 2) 42a thereof guided by a pair of guide members 44a and 44b. This x-axis frame 42 is formed into a hollow shape over the full length of a substantially U-shaped portion except a third side 42c opposed to the first side 42a, and a second ball screw 46 has its opposite ends pivotally supported on the first side 42a while extending along the direction of the x-axis. A second nut member 48 is threadably engaged with the second ball screw 46, and is fixed on the aforementioned one stand 40a. One end of the second ball screw 46 is connected to the drive shaft of an x-axis drive motor 50 contained in the first side 42a of the x-axis frame 42.

By the x-axis drive motor 50 being started in this manner, the x-axis frame 42 is generally moved along the direction of the x-axis through the threadable engagement between the second ball screw and the second nut member 48.

The second and fourth sides of the x-axis frame 42 are designed to slide on the upper surface of the other stand 40b said pair of stands 40a and 40b through a cam follower, not shown.

On the other hand, in the space surrounded by the x-axis frame 42, a y-axis frame 52 formed into a substantially square frame shape is contained for movement along the direction of the y-axis. A pair of connection stays 54a and 54b protrude rightwardly as viewed in FIG. 2 from a second side (the right side in FIG. 2) 52b of the y-axis frame 52, and a y-axis guide member 56 extending along the direction of the y-axis is integrally connected to the tip ends of the connection stays 54a and 54b.

An engagement member 58 protruding inwardly of the second side 42b is integrally attached to the aforedescribed y-axis guide member 56. On the other hand, a third ball screw 60 has its opposite ends pivotally supported on the second side 42b of the x-axis frame 42 while extending along the direction of the y-axis. A third nut member 62 is threadably engaged with the third ball screw 60, and is fixed to the above-described engagement member 58. One end of the third ball screw 60 is connected to the drive shaft of a y-axis drive motor 64 contained in the second frame 42b of the x-axis frame 42.

By the y-axis drive motor 64 being started in this manner, the y-axis frame 52 is generally moved along the direction of the y-axis through the threadable engagement between the third ball screw 60 and the third nut member 62.

A fourth side (the left side in FIG. 2) 52d of the y-axis frame 52 is designed to be slidably supported on the fourth side 42d of the above-described x-axis frame 42 through a cam follower, not shown.

Further, in the space surrounded by the y-axis frame 52, the above-mentioned rotary table 38 is supported for rotation about its own center axis through a plurality of guide rollers 66. This rotary table 38, as shown, is formed into the shape of a circular frame, and a pair of parallel guide rod mounting stays 68a and 68b are extended on the rotary table 38 while extending along the direction of the y-axis, and a pair of parallel guide rods 70a and 70b are mounted on the guide rod mounting stays 68a and 68b while extending along the direction of the x-axis.

Thus, the above-described base plate 18 is mounted on the rotary table 38 while being sandwiched between the two guide rods 70a and 70b.

The pair of guide rods 70a and 70b are movable along the direction of the y-axis, and are set so that they are moved in conformity with the size (particularly the length along the direction of the y-axis) of the base plate 18 mounted thereon and can reliably sandwich the base plate 18 from the opposite sides thereof. These guide rods 70a and 70b are designed to be fixed at preset positions by set screws not shown.

On the y-axis frame 52 located on one side (the lower side in FIG. 2) of the rotary table 38, there is disposed a friction driving mechanism 72 as a base plate rotating mechanism for rotatively driving the same which forms a feature of the present invention.

By the above-described construction, the rotary table 38 is moved independently along the directions of the x-axis and the y-axis and is rotated along a direction $\theta$, whereby the base plate 18 can adjust any point thereon to the mounted position B₆ of an electronic part on the turret head mechanism 20.

Figure 3:
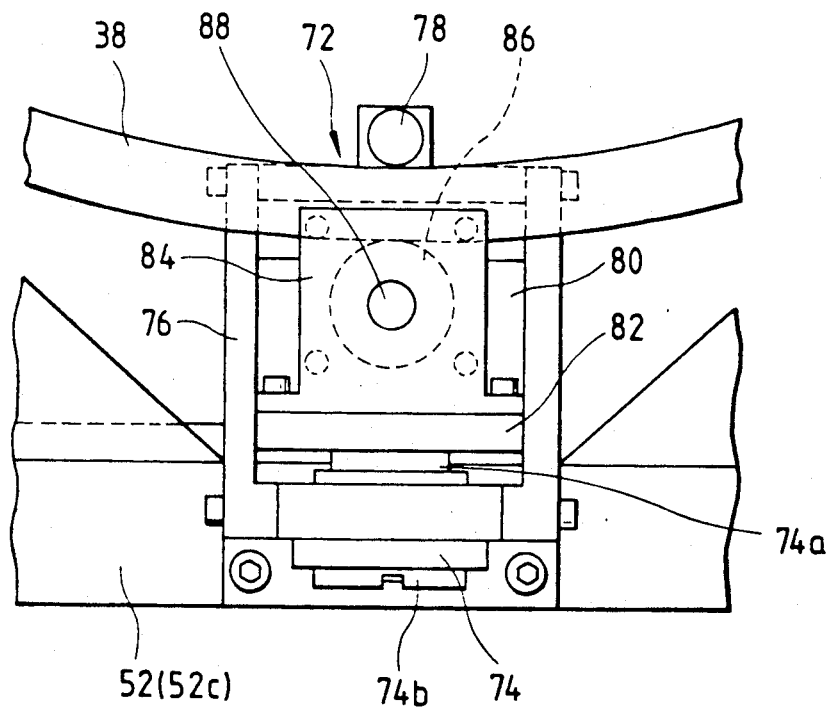
FIG. 3 is a plan view showing the construction of the rotating friction driving portion of the base plate rotating mechanism shown in FIG. 2 on an enlarged scale.

Finally, the construction of a friction driving mechanism 72 as a base plate rotating mechanism for rotatively driving the rotary table 38 will be described in detail with reference to FIGS. 3 and 4.

This friction driving mechanism 72 is provided with a leaf spring mechanism 74 fixed onto the y-axis frame 52. The leaf spring mechanism 74 has radially inwardly thereof a push lever 74a movable back and forth along the radial direction of the rotary table 38, and this push lever 74a is set so as to be moved back and forth along the radial direction by rotating an adjusting screw 74b mounted radially inwardly thereof. That is, the push lever 74a is set so that the pushing force thereof can be adjusted by rotating the adjusting screw 74b. Also, the opposite end portions of a planar U-shaped pressing stay 76 are integrally attached to the leaf spring mechanism 74, and radially inwardly of this pressing stay 76, a nipping roller 78 is supported for rotation about the vertical axis.

On the other hand, the opposite end portions of a planar U-shaped guide stay 80 are integrally attached to the above-described y-axis frame 52. On the base end side of the guide stay 80, the intermediate portion of a rising support stay 82 is supported for sliding movement along the radial direction of the rotary table 38. That is, guide slots 82a and 82b in which the two extending-out portions of the above-described guide stay 80 are fitted are formed in the intermediate portions of the opposite side edges of the support stay 82, and by the two extending-out portions of the guide stay 80 being fitted in the guide slots 82a and 82b, respectively, the support stay 82 is supported for sliding movement and against downward fall.

A mounting stay 84 is mounted on the upper end of the support stay 82 while extending radially inwardly thereof, and the upper end of a drive shaft 88 to which a driving roller 86 is coaxially fixed is rotatably supported on the mounting stay 84. The driving roller 86 has its height set so that it is flush with the above-mentioned nipping roller 78. That is, the driving roller 86 is in rolling contact with the outer peripheral surface of the above-described rotary table 38, and the nipping roller 78 is in rolling contact with the inner peripheral surface of the rotary table, and by being nipped by and between the driving roller 86 and the nipping roller 78, the rotary table 38 is set so that the frictional engagement force between the driving roller 86 and the rotary table 38 is prescribed.

A rotative driving motor 90 for rotatively driving the drive shaft 88 is mounted on the lower end of the support stay 82, and this rotative driving motor 90 and the drive shaft 88 are connected together through a coupling mechanism 92 in their adjusted state. The support stay 82 is set so that its back surface (i.e., its radially outward surface) is pressed by the push lever 74a of the above-described leaf spring mechanism 74.

Figure 4:
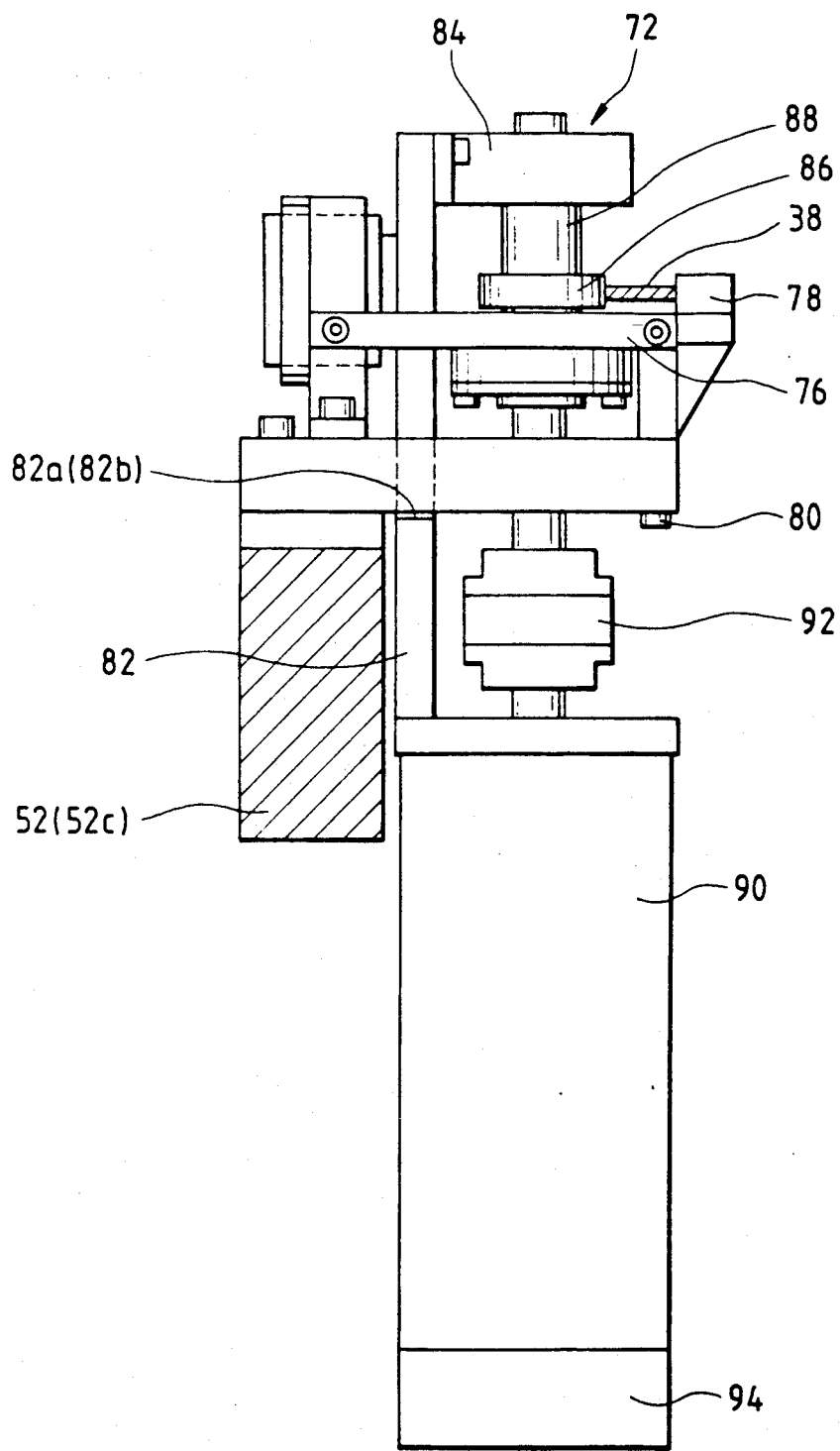
FIG. 4 is a side view showing the rotating friction driving portion on an enlarged scale.

In the friction driving mechanism 72 constructed as described above, the adjusting screw 74b of the leaf spring mechanism 74 is rotated in the state shown in FIG. 4, whereby the push lever 74a biases the support stay 82 radially inwardly, and the driving roller 86 mounted thereon is operated so as to move radially inwardly. On the other hand, by the radially inward movement of this support stay 80, the leaf spring mechanism 74 itself is subjected to a reaction force directed radially inwardly and as a result, the nipping roller 78 mounted on the pressing stay 76 is relatively moved radially outwardly.

As a result, the rotary table 38 is subjected to a radially inwardly directed pressing force by the driving roller 86 and is also subjected to a radially outwardly directed pressing force by the nipping roller 78, and is strongly nipped by and between the two rollers 86 and 78. Thus, the rotary table 38 is subjected to the balanced pressing forces by the two rollers 86 and 78 and therefore, the rolling contact force (the frictional engagement force) by the driving roller 86 increases, but the biasing of the center of rotation of the rotary table 38 does not occur.

When the rotative driving motor 90 is started in a state in which the rolling contact force of the driving roller 86 with the rotary table 38 is set to a predetermined value like this, the drive shaft 88 is rotatively driven through the coupling mechanism 92 in response to said starting and accordingly, the driving roller 86 integrally mounted on the drive shaft 88 is likewise rotatively driven with a result that the rotary table 38 which is in rolling contact with the driving roller 86 is also rotated.

A rotary encoder 94 is mounted on the rotative driving motor 90, and the amount of driving by this rotative driving motor 90, i.e., the amount of rotation of the driving roller 86, is always numerically detected and thus, the rotary table 38 is rotatively driven to a desired rotated position on the basis of the result of this detection.

In the manner described above in detail, in the base plate positioning mechanism 10 of this embodiment, the x-axis frame 42 is rotatively driven along the x-axis through the x-axis drive motor 50, the y-axis frame 52 supported on the x-axis frame 42 is rotatively driven along the y-axis through the y-axis drive motor 64, and the rotary table 38 supported on the y-axis frame 52 is rotatively driven along the direction $\theta$ through the friction driving mechanism 72 provided with the rotative driving motor 90, whereby any position of the base plate 18 fixed to the rotary table 38 can be moved to a position accurately conforming to the mounted position $B_b$ of the electronic part in the turret head mechanism 20 and also the relation in the rotated position between the electronic part and the base plate 18 can be set freely.

Also, in the base plate positioning mechanism 10 of this embodiment, a belt or a gear is not used, but the rotary table 38 is rotatively driven through the friction driving mechanism 72 and therefore, problems peculiar to the prior art such as the great backlash caused by the adoption of a gear, the annoying noise, the impossibility of high-speed rotation resulting from the adoption of a belt, and the complication of control are eliminated reliably.

By the construction of the friction driving mechanism 72 as the rotative driving mechanism as described above, the rotary table 38 and the base plate 18 placed thereon are rotated, but if any slip or abrasion occurs on the frictional contact surface (hereinafter simply referred to as the P surface) between the outer peripheral surface of the rotary table 38 and the outer peripheral surface of the driving roller 86, the amount of error thereof will accumulated each time the rotary table 38 is rotated, and the angle detected by the encoder 94 will become different from the actual angle of the rotary table 38.

So, in this embodiment, an error absorbing mechanism 96 for absorbing such error is provided adjacent to the above-described friction driving mechanism 72. On the other hand, on the rotary table 38, there is set the stop position thereof for each 90°, and in this embodiment, correspondingly to these stop positions, regulation holes 98a, 98b, 98c and 98d are formed at four locations (i.e., four locations of 90°, 180°, 270° and 360° (0°) as the angles of rotation).

Figure 2:
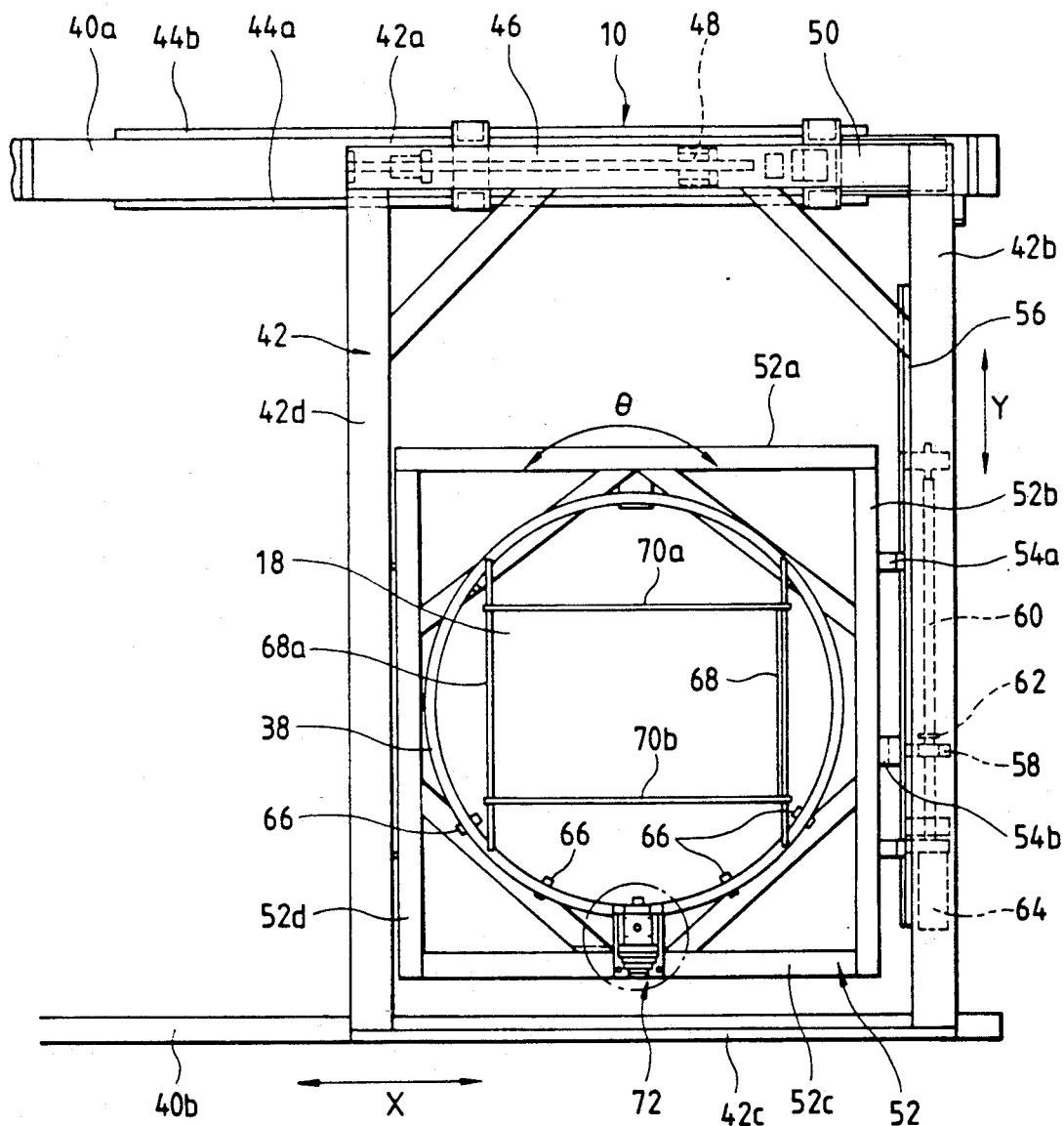
FIG. 2 is a plan view showing the construction of the base plate rotating mechanism shown in FIG. 1 in detail.
Figure 5A:
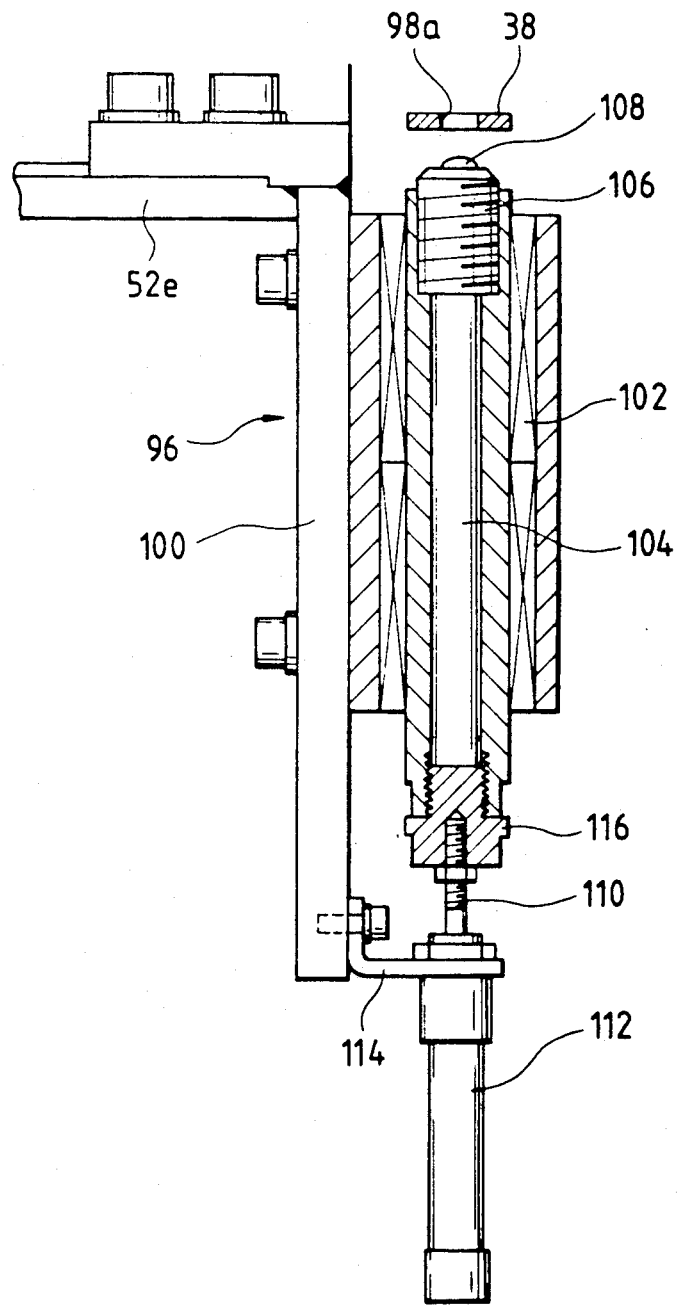
FIGS. 5A and 5B are a side cross-sectional view and a front view, respectively, showing the construction of an error absorbing mechanism.
Figure 5B:
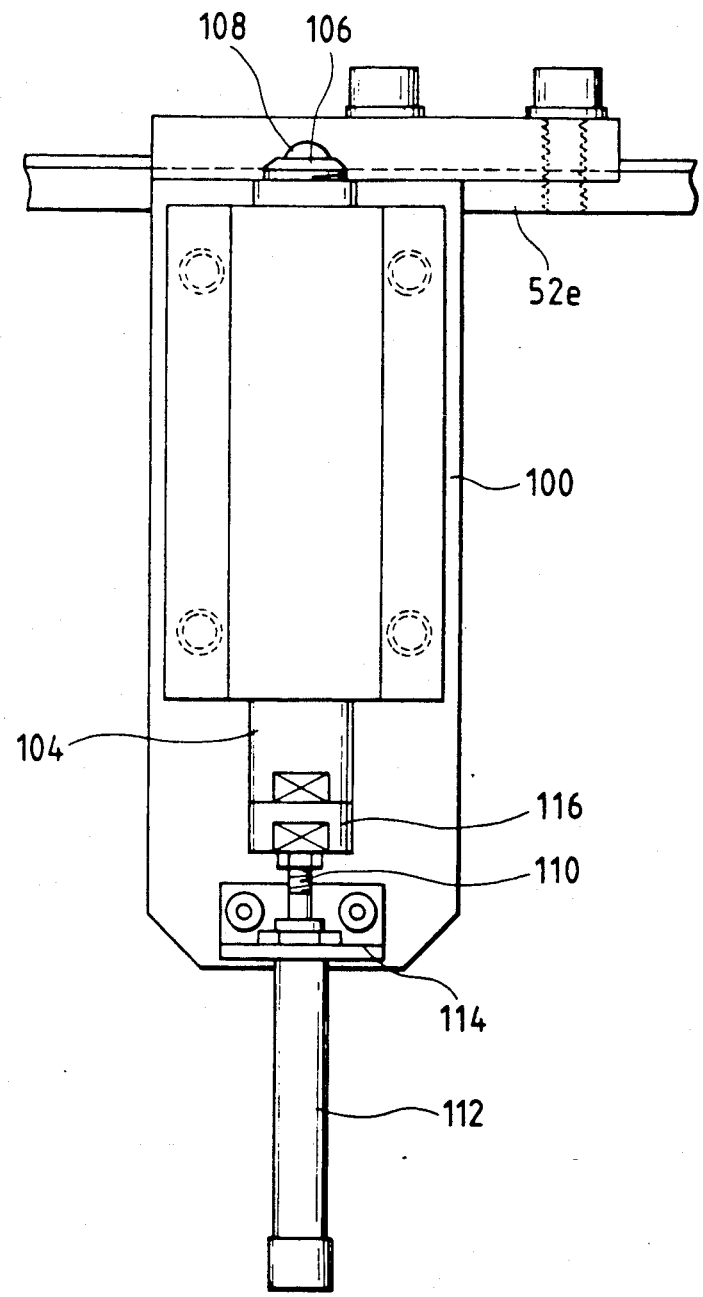

This error absorbing mechanism 96 is such that as shown in FIG. 2, a mounting member 100 mounted in a depending state, as shown in FIGS. 5A and 5B, on a connecting side 52e which connects the first and fourth sides 52a and 52d of the y-axis frame 52 together is mounted while extending vertically. On this mounting member 100, a plunger rod 104 is vertically movably supported through a sliding guide member 102. A plunger 106 is fixed to the upper end of the plunger rod 104. A semispherical positioning pin 108 which is fitted into one of the above-mentioned regulation holes 98 from below is secured to the upper surface of the plunger 106.

On the other hand, below the plunger rod 104, an air pressure cylinder 112 is fixed to the mounting member 100 through a mounting stay 114 so as to be able to move a piston rod 110 along the vertical direction. The upper end of the piston rod 110 and the lower end of the plunger rod 104 are connected together through a connecting rod 116.

Here, the position at which the above-described positioning pin 108 is disposed is defined as a position in which when the rotary table 38 has been accurately positioned at the four locations of 90°, 180°, 270° and 360° (0°) as the angles of rotation, the positioning pin can fit into the four regulation holes 98a, 98b, 98c and 98d from below to prescribe the rotated positions of the rotary table 38 accurately.

By so constructing the error absorbing mechanism 96, even if any slip or abrasion occurs on the P surface, the amount of error thereof will be eliminated each time the rotary table 38 is stopped at a target position, and thus, the error will not accumulate but the angle detected by the encoder 94 will accurately coincide with the actual angle of the rotary table 38.

The operation of the error absorbing mechanism constructed as described above will now be described with reference to the error absorption control means of FIG. 6A, the flow chart of FIG. 6B and the illustration of the operation of the rotary table of FIG. 6C.

Figure 6A:
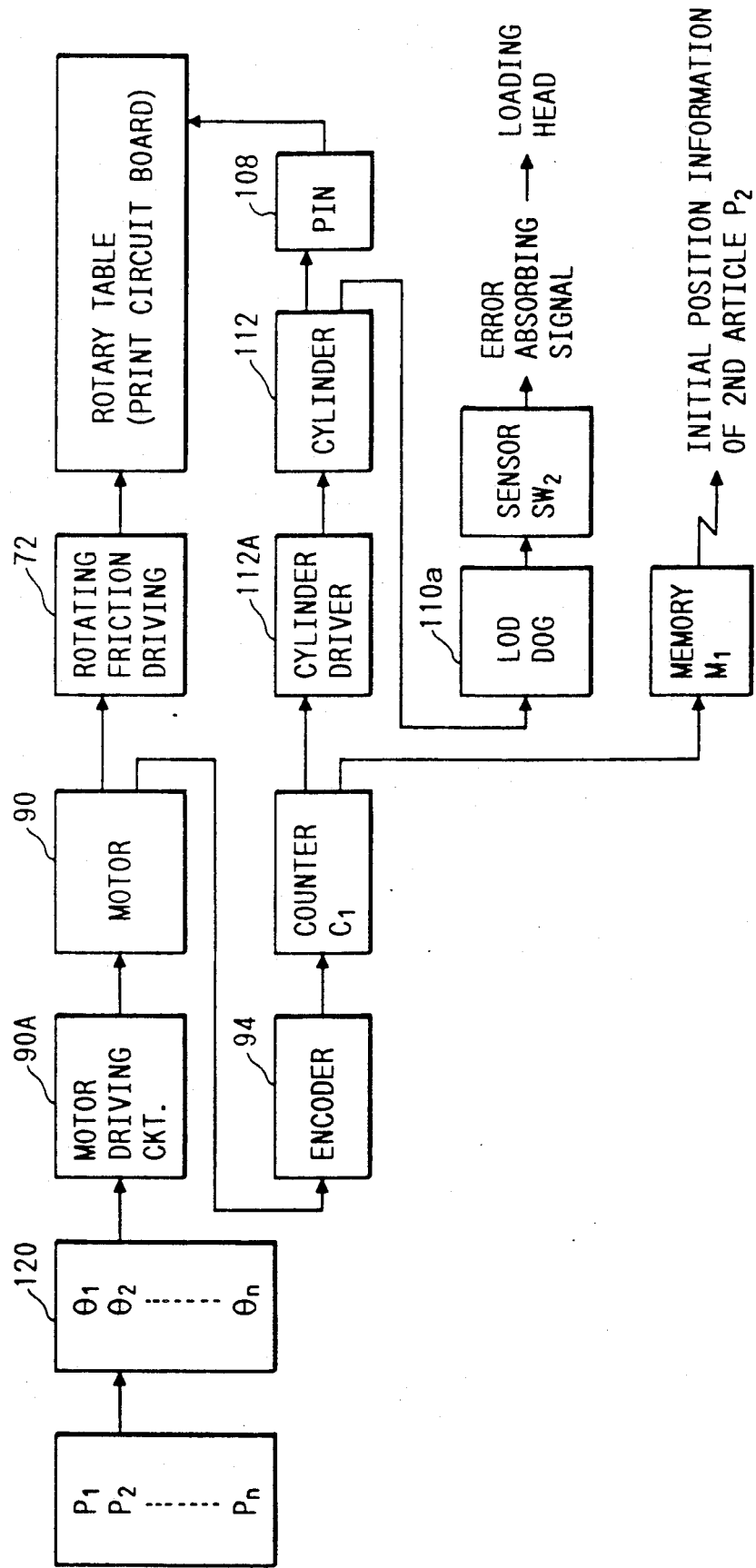
FIG. 6A is a block diagram showing the rotative control of a rotary table 38.
Figure 6B:
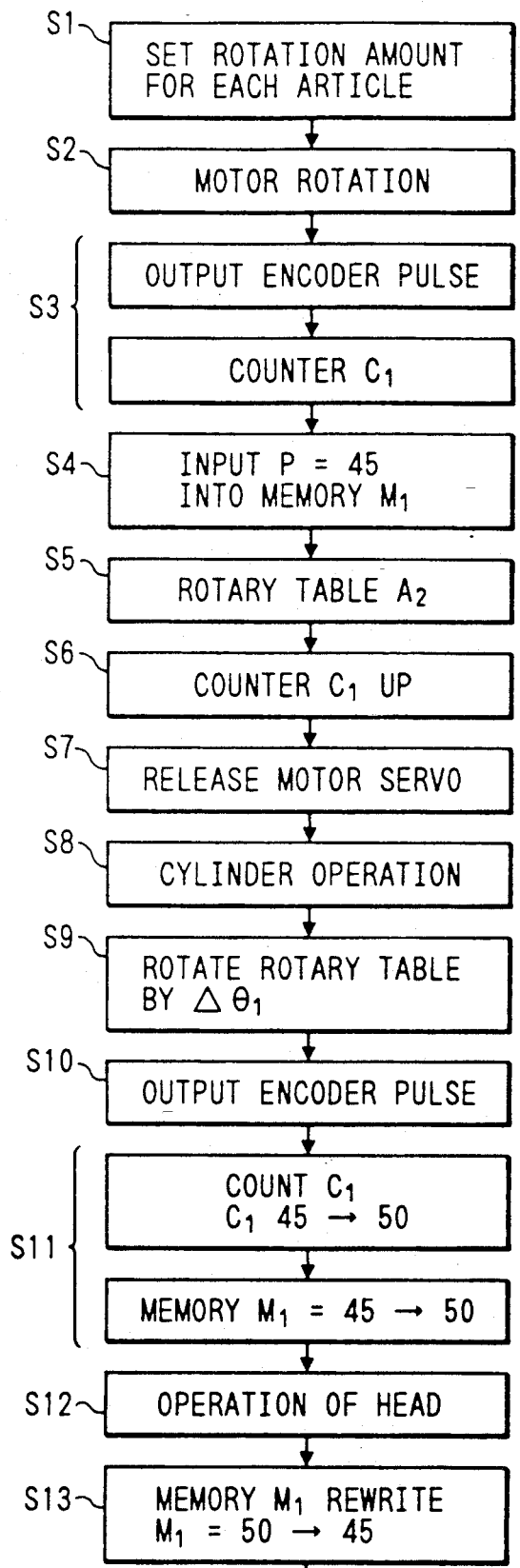
FIG. 6B is a flow chart showing the operation procedure of the error absorbing mechanism.

In FIG. 6A, the reference numeral 120 designates means for setting the amount of rotation of a print circuit board from the reference position of the print circuit board to the mounted position when a plurality of parts $P_1, P_2, \ldots, P_n$ are mounted on the print Circuit board. In the present embodiment, the print circuit board is rotated by an angle $\theta_1 = 45°$ from the reference position to mount the part $P_1$ thereon. It is to be understood that the print circuit board is rotated by an angle $\theta_2 = 45°$ from the reference position to mount the part $P_2$ thereon. The amounts of rotation $\theta_3, \theta_4, \ldots, \theta_n$ are set to mount the parts $P_3, P_4, \ldots, P_n$ on the circuit print board (step S1). The motor 90 is first rotated by a motor driving circuit 90A to mount the part $P_1$ on a predetermined location on the print circuit board (step S2). In this case, a signal for rotating the motor by $\theta_1 = 45°$ is output from the rotation amount setting means 120, and the motor 90 is rotated by an amount corresponding to $\theta_1 = 45°$.

Accordingly, a pulse corresponding to $\theta_1 = 45°$ is output from the encoder 94 connected to the motor 90 (step S3). The pulse of this encoder 94 is input to a memory $M_1$ via a counter $C_1$, and a pulse number corresponding to $\theta_1 = 45°$, e.g. P=45, is recorded (step S4). When the rotary table 38 is rotated by an amount corresponding to $\theta_1 = 45°$ by the motor 90, the rotary table 38 is stopped, but since the drive force of the motor 90 is transmitted through the rotational friction driving means, the aforementioned slip occurs.

Figure 6C:
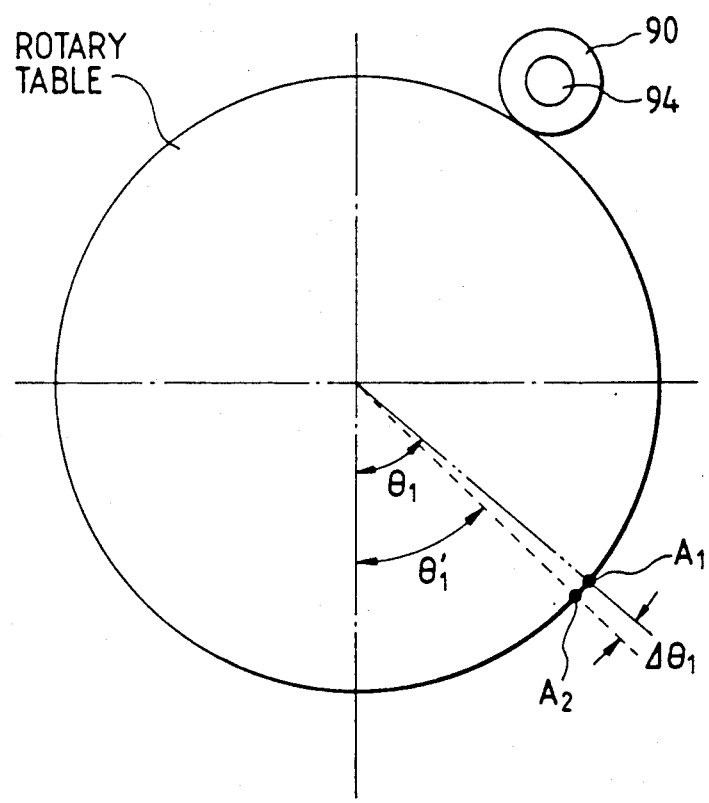
FIG. 6C illustrates the rotated state of the rotary table.

As a result, the actual stopped position of the rotary table 38 is not a regular stopped position $A_1$, but $A_2$ as shown in FIG. 6C (step S5). That is, due to the slip by the rotational friction driving means, the rotary table 38 is rotated by $\theta_1' \neq \theta_1$.

The stopped position $A_2$ of the rotary table 38 deviates by $\Delta\theta_1$ from the regular stopped position.

Further, when the counter $C_1$ for counting the encoder pulse resulting from the rotation of the motor 90 terminates counting (step S6), the servo driving of a motor driving system is released by the count termination signal (step S7) and at the same time, the error absorbing mechanism is operated (step S8). That is, cylinder operating means 112A is operated by the count termination signal and the pin 108 is driven through a cylinder 112. When the rotary table 38 is at the stopped position $A_2$, the center of the regulation hole 98a in the rotary table 38 deviates from the axis center of the pin 108. When the pin 108 is driven, the rotary table 38 is freely rotatable and therefore is rotated toward the regular stopped position $A_1$, and the rotary table 38 is stopped at the regular stopped position $A_1$ with the pin 108 being completely engaged with the regulation hole (step S9).

With the rotation of the rotary table caused by the operation of the pin 108, the motor 90 rotates by $\Delta\theta_1$, whereby a pulse corresponding to $\Delta\theta_1$ is output from the encoder 90A (step S10), and through the counter $C_1$, the recorded information in the memory $M_1$ is changed from the aforementioned pulse count number P45 to P50 (step S11). The state in which the rotary table 38 has been stopped at the regular stopped position $A_1$ is detected, and the mounting of the part $P_1$ by the mounting head is effected, for example, by the termination signal of the additional counting of the second count signal of the counter $C_1$ (the additional counting from 45 pulses to 5 pulses resulting from the rotation of the rotary table by $\Delta\theta_1$) (step S12). The operation of the part $P_1$ being mounted at a predetermined location on the print circuit board is terminated by the operation of the mounting head of the step S1 to the step S12, and the present invention has the function of preventing the rotational error $\Delta\theta_1$ caused by the slip by the aforedescribed rotational friction driving means from being cumulated when the rotary table 38 is successively rotated for mounting the next parts $P_2, P_3, \ldots$.

That is, the rotation of the rotary table 38 for mounting the second part $P_2$ is further effected by $\theta_2 = 90°$ with the stopped position of the rotary table for mounting the first part $P_1$ as the origin. Therefore, when the steps S1 to S12 are repeated to recorded information in the memory $M_1$, i.e., the information $M_1 = 50$ of the step S11, be rewritten to pulse information $M_1 = 45$ corresponding to the regular stopped position $A_1$.

Therefore, in the present embodiment, the rotary table 38 is finely rotated with the engaging operation of the pin 108 at the step S9, and the information in the memory $M_1$ changed from $M_1 = 45$ to $M_1 = 50$ along therewith is rewritten to $M_1 = 45$ by an operation signal output from the mounting head to mount the first part $P_1$ (step S13).

When the second part $P_2$ is to be mounted, the information $\theta_2 = 90°$ is output from the rotation amount setting means, and the actual amount of rotation of the rotary table 38 is $\theta_2 - \theta_1 = 90° - 45° = 45°$. Therefore, the information in the memory $M_1$ corrected at the step S13 is fed back to the rotation amount setting means and the corrected information in the memory $M_1$ is the rotation origin position of the rotary table 38 for mounting the second part $P_2$.

Thereafter, for the mounting of the second part $P_2$, the step S2 and subsequent steps are executed, that is, the motor is rotated, the encoder outputs a pulse and the counting is started, and the mounting of the second part $P_2$ onto a predetermined location on the print circuit board is effected by the mounting head.

At the step S12 in the aforedescribed embodiment, it has been described that the starting of the inserting operation of the mounting head is effected by the second count termination signal of the counter $C_1$, but alternatively, it may be effected after the actual operation of the error absorbing pin 108 is confirmed. That is, a sensor dog 110a is attached to the rod 110 moved back and forth by the cylinder 112 of FIG. 5A, and a proximate switch SW2 as pin operation confirming means operated by the sensor dog 110a is provided. It is detected by the switch SW2 that the pin 108 is fitted into the regulation hole in the rotary table by the operation of the cylinder 112 and the operation of absorbing the error of the stopped position of the rotary table has been completed, and the signal of the switch SW2 is used as a starting command signal for the inserting operation of the mounting head. In the case of an embodiment in which the inserting operation of the mounting head is started by the signal from the above-mentioned pin operation confirming means SW2, it is detected that the error absorption of the rotary table by the pin 108 has been actually effected, whereafter the inserting operation is performed and therefore, the placement of the part onto a predetermined location on the print circuit board is accomplished accurately.

According to the present invention, the error of the stopped position of the rotary table caused by the rotational friction driving means is corrected by error absorbing means comprising a cylinder pin or the like, and the information into the memory $M_1$ of the encoder output pulse created by the motor rotation during the correcting operation is corrected to the pulse information $P=45$ corresponding to the regular stopped position $A_1$, whereby the memory information can be used as the origin position information of the rotary table when mounting a plurality of parts and therefore, the control of the rotation of the rotary table can be accomplished accurately.

Also, by repeating the correction of the memory information each time a plurality of parts are mounted onto the print circuit board, the accumulation of the error does not occur even if the rotational error of the rotary table for each part occurs irregularly.

The construction of an embodiment in which the improvement in the tact time of the part mounting apparatus which is a third object of the present invention is made will now be described in detail with reference to FIGS. 7 to 11.

Figure 7:
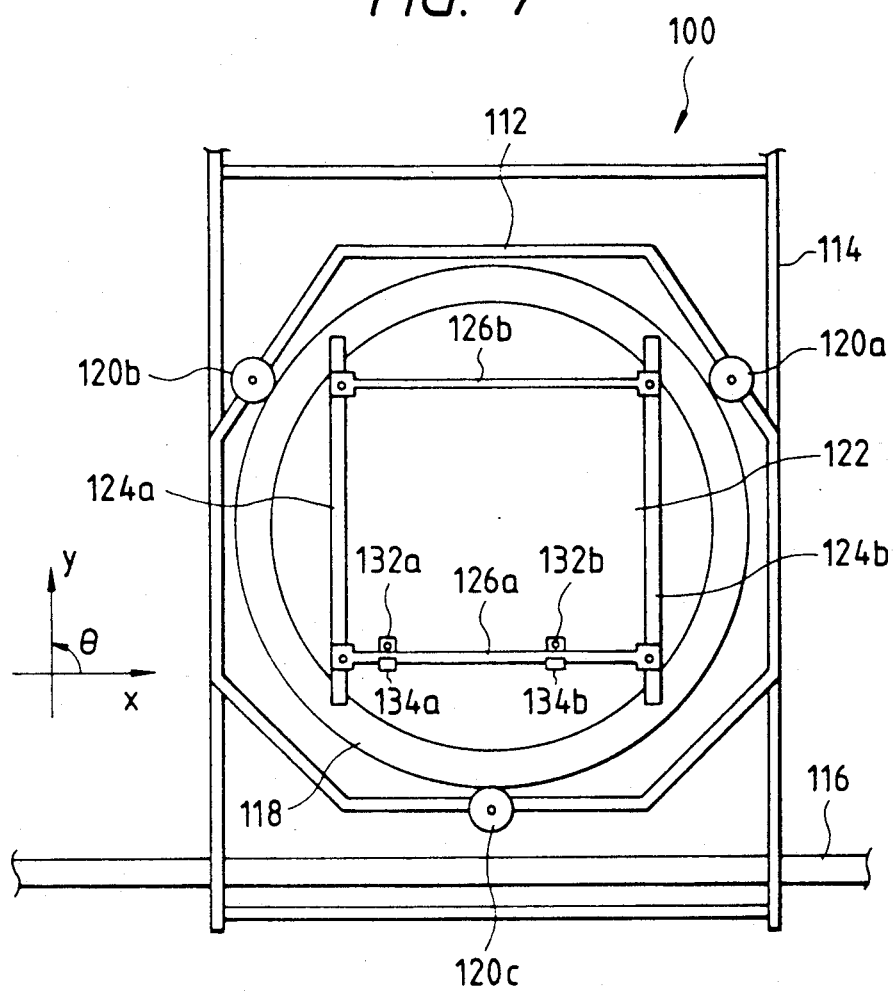

As shown in FIG. 7, the mounting apparatus 100 of this embodiment is provided with a y-axis direction frame guide 114 movable along the x-axis. This y-axis direction frame guide 114 is supported for movement along the direction of the x-axis by an x-axis direction frame guide 116 extending along the direction of the x-axis. A support frame 112 is formed into a planar, substantially octagonal shape, and is supported for movement along the direction of the y-axis by the y-axis direction frame guide 114 extending along the direction of the y-axis. This support frame 112 is adapted to be moved to any position in the plane x-y through an x-y-axis moving mechanism, not shown.

A disk table 118 is rotatably supported inwardly of the support frame 112 and is in rolling contact with three driving rollers 120a, 120b and 120c mounted on the support frame 112 at substantially equal angles, and is set so as to be rotatively driven about its own center axis by the rotative driving of these rollers. These three driving rollers 120a, 120b and 120c are adapted to be rotatively driven in synchronism with one another and moreover at equal speeds by a rotative driving mechanism, not shown.

A base plate 122 on which electronic parts or the like, not shown, are mounted may be placed on the disk table 118. That is, this disk table 118 is provided thereon with a pair of y-axis guides 124a and 124b disposed parallel to each other so as to guide the opposite end edges (the left and right edges as viewed in FIG. 7) of the base plate 122 along the y-axis. A pair of movable x-axis guides 126a and 126b mounted for movement along the direction of the y-axis relative to the y-axis guides 124a and 124b are disposed on the disk table 118 to guide one and the other end edges (the lower and upper edges as viewed in FIG. 7) of the base plate 122 along the x-axis.

Figure 8:
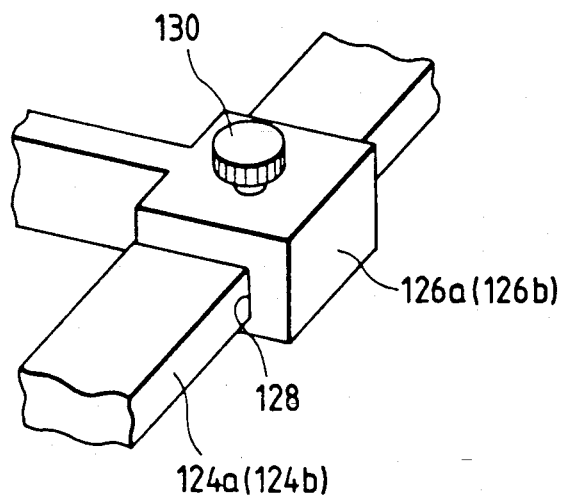

More particularly, as shown in FIG. 8, the opposite ends of the movable x-axis guides 126a and 126b are formed with insertion holes 128 into which the corresponding y-axis guides 124a and 124b are inserted, and with the y-axis guides inserted into the insertion holes, respectively, the movable x-axis guides 126a and 126b are slidable along the y-axis independently of each other. On the other hand, positioning screws 130 for fixing the movable x-axis guides 126a and 126b at any y-axis positions are threadably engaged with the opposite end portions of each movable x-axis guide 126a, 126b. That is, by these positioning screws 130 being fed so as to be fastened relative to the corresponding y-axis guides 124a and 124b, the movable x-axis guides 126a and 126b are fixed at any positions relative to the corresponding y-axis guides 124a and 124b.

Figure 9:
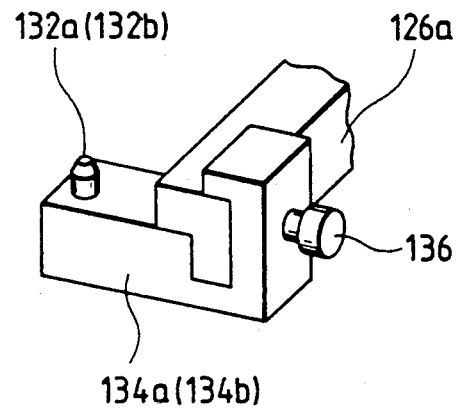

A pair of movable positioning pins 132a and 132b are mounted on the lower movable x-axis guide 126a for movement along the direction of the x-axis. More particularly, as shown in FIG. 9, a pair of pin supporting members 134a and 134b are nested in and mounted on the lower movable x-axis guide 126a for sliding movement along the x-axis and against downward fall. The above-mentioned movable positioning pins 132a and 132b are risingly secured to the tip ends of the corresponding pin supporting members 134a and 134b.

On the other hand, positioning screws 136 for fixing the pin supporting members 134a and 134b at any x-axis positions are threadably engaged with the back surfaces of the pin supporting members 134a and 134b. That is, by these positioning screws 136 being fed so as to be fastened relative to the movable x-axis guide 126a, each pin supporting member 134a, 134b is fixed at any position relative to the movable x-axis guide 126a.

This mounting apparatus 100 is constructed as described above and therefore, when the size of the base plate 122 changes, and more specifically, when the base plate 122a shown in FIG. 10A is replaced by a smaller base plate 122b as shown in FIG. 10B, the movable x-axis guides 126a and 126b are moved inwardly along the y-axis so as to come close to each other and also the movable positioning pins 132a and 132b are moved inwardly along the x-axis so as to come close to each other, whereby the base plate 122a (122b) can be supported with the center thereof always made coincident with the center of rotation of the disk table 118.

As a result, even in a case when after, as shown in FIG. 11A, a part has been inserted into a point C far from the center of rotation O of the disk table 118, an electronic part is to be mounted with the direction changed by 180° to a point D near the point C, the disk table 118 is first rotated by 180° about the center of rotation O, whereafter as shown in FIG. 11B, the support frame 112 is moved by a predetermined amount along the x-axis and the y-axis, whereby the amounts of movement Δx and Δy of the disk table 118 in the directions x and y can be made small.

That is, according to the mounting apparatus 100 of this embodiment, even in a case when after an electronic part has been inserted into the point C far from the center of rotation O of the disk table 118, the electronic part is to be mounted with the direction changed by 180° to the point D near the point C, the tact time can be minimized and thus, the work efficiency can be improved.

The present invention is not restricted to the above-described embodiment, but of course can be variously modified without departing from the gist of the present invention.

For example, in the above-described embodiment, the y-axis guides 124a and 124b have been described as being fixed and the x-axis guides 126a and 126b have been described as being movable, whereas the present invention is not restricted to such a construction, but the y-axis guides can be made movable and the x-axis guides 126a and 126b can be fixed to thereby achieve a similar effect. In such a case, the pair of movable positioning pins 132a and 132b are movably mounted on one of the pair of y-axis guides 124a and 124b which are made movable.

As described above, the mounting apparatus for electronic parts or the like according to the present invention is provided with a support table on which a base plate on which electronic parts or the like are mounted is placed and which is movable to any position on the plane x—y and supported for rotation to any rotated position, a pair of movable guide members disposed for movement along one of the x axis and the y-axis and guiding the end edge along the other axis on the base plate so as to sandwich said end edge from the opposite sides thereof, and a pair of positioning pins mounted on one of said pair of movable guide members for movement along the other axis, and is characterized in that even when a base plate of any size is placed on the support table, the center of the base plate and the center of rotation of the support table can always be brought into coincidence with each other.

Thus, according to the present invention, there is provided a mounting apparatus for electronic parts or the like in which the tact time is not uselessly lengthened even when electronic parts or the like are mounted at any locations on base plates of different sizes.

A case wherein the construction of an embodiment of the mounting apparatus according to a fourth task of the present invention is applied to a mounting apparatus for mounting electronic parts on a base plate will hereinafter be described in detail with reference to FIGS. 12 to 15 of the accompanying drawings.

As shown in FIG. 12, the base plate mounting device 200 of this mounting apparatus is provided with an x-axis guide shaft 212 extending along the x-axis in the figure, and a y-axis guide frame 214 formed into the shape of a substantially rectangular frame is mounted on the x-axis guide shaft 212 for movement along the x-axis. A support frame 216 formed into the shape of a substantially octagonal frame is mounted on the y-axis guide frame 214 for movement along the y-axis. This support frame 216 is designed such that its y-axis direction position is set arbitrarily by the support frame being moved along the y-axis in the y-axis guide frame 214 through an x-y axis moving mechanism, not shown, and that its x-axis direction position is set arbitrarily by the y-axis guide frame 214 being moved along the x-axis guide shaft 212.

A rotary table 218 is rotatably supported inside the support frame 216. Three driving rollers 220a, 220b and 220c mounted on the support frame 216 at substantially equal angles ar in rolling contact with the outer periphery of the rotary table 218, and by these driving rollers 220a, 220b and 220c being rotatively driven, the rotary table 218 may be rotatively driven about its own center axis. These three driving rollers 220a, 220b and 220c are adapted to be rotatively driven in synchronism with one another and at the same rotational speed by a rotative driving mechanism, not shown.

A supporting mechanism 224 on which a base plate 222 on which electronic parts or the like, not shown, are mounted is supported and fixed is mounted on the rotary table 218. Although the construction of this supporting mechanism 224 will be described later in detail, the base plate 222 supported and fixed on this supporting mechanism 224 is positioned with its x-axis direction position, its y-axis direction position and its rotated position being arbitrarily prescribed by the above-described construction.

The construction of the supporting mechanism 224 will now be described. This supporting mechanism 224 is designed so as to be capable of supporting a base plate 222 of any size thereon. That is, this supporting mechanism 224 is provided with a pair of y-axis guide frames 226 and 228 as fixed guide members extending along the direction of the y-axis parallel to each other so as to guide the opposite end edges (the left and right end edges as viewed in FIG. 12) of the base plate 222 along the direction of the y-axis on the rotary table 218. The two y-axis guide frames 226 and 228 are set so as to be spaced apart from each other along the direction of the x-axis by a distance corresponding to the maximum size of the base plate 222 supported thereon.

Also, this supporting mechanism 224 is provided with a pair of x-axis guide frames 230 and 232 as movable guide members extending along the direction of the x-axis parallel to each other so as to guide the opposite end edges (the upper and lower end edges as viewed in FIG. 12) of the base plate 222 along the direction of the x-axis on the rotary table 218. The upper portions of the pair of left and right y-axis guide frames 226 and 228 are inserted in the left and right ends, respectively, of the upper x-axis guide frame 230 as viewed in FIG. 12 and thus, the upper x-axis guide frame 230 is supported for movement along the y-axis. On the other hand, the lower portions of the pair of left and right y-axis guide frames 226 and 228 are inserted in the left and right ends, respectively, of the lower x-axis guide frame 232 as viewed in FIG. 12 and thus, the lower x-axis guide frame 232 is supported for movement along the y-axis. That is, the two x-axis guide frames 230 and 232 are mounted independently of each other for movement along the direction of the y-axis.

Recesses 234 for receiving the corresponding end edges of the base plate 222 are formed in the upper surfaces of the x-axis guide frames 230 and 232 which are inner portions opposed to each other. The depth of these recesses 234 is set to a value slightly greater than the thickness of the base plate 222 received therein. Also, a top plate 236 comprising a thin plate is mounted on the upper surfaces of the x-axis guide frames 230 and 232 by means of a screw 238 (shown in FIG. 14) in such a manner as to cover the above-described recesses 234. Thus, in the inner sides of the upper edges of the x-axis guide frames 230 and 232, there are formed grooves in which the corresponding end edges of the base plate 222 are inserted and supported.

Also, the x-axis guide frames 230 and 232 are set so as to be secured to the left and right y-axis guide frames 226 and 228 and have their positions fixed by fastening screws 240 provided at the opposite ends thereof.

With such a construction, when the left y-axis guide frame 226 is prescribed as the reference side, the x-axis guide frames 230 and 232 are moved in this supporting mechanism 224, whereby the upper and lower end edges of the base plate 222 supported thereon are sandwiched by and between the x-axis guide frames 230 and 232, and in such sandwiched state, the base plate 222 is brought into contact with the left y-axis guide frame 226, whereby the three sides of the base plate 222 are guided. By fastening the above-mentioned screws 240, this guided state is fixed and thus, the base plate 222 is reliably supported on the rotary table 218 by the supporting mechanism 224.

In the thus constructed supporting mechanism 224, a positioning mechanism 242 is provided to accurately prescribe the supported position of the base plate 222 supported and fixed thereon.

The construction of this positioning mechanism 242 will now be described in detail with reference to FIGS. 13 to 15.

Figure 13A:
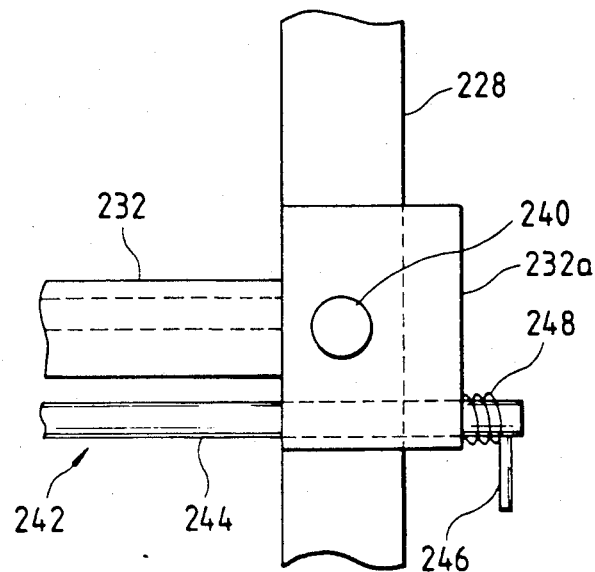
FIGS. 13A, 13B and 13C show the mounted state of a support rod in a positioning mechanism provided in the mounting apparatus, FIG. 13A being a plan view thereof, FIG. 13B being a front view thereof, and FIG. 13C being a side view thereof.
Figure 13B:
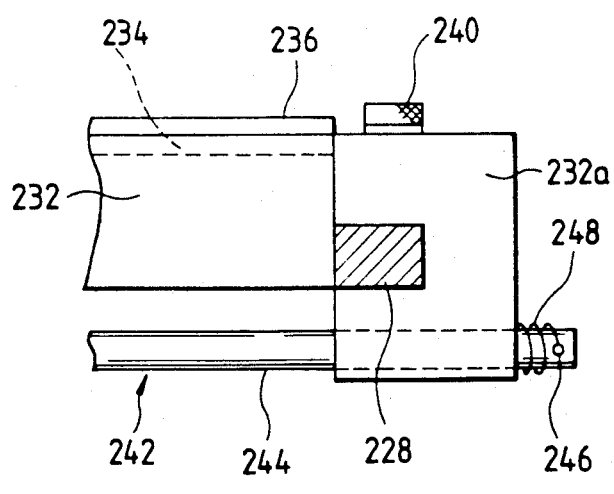
Figure 13C:
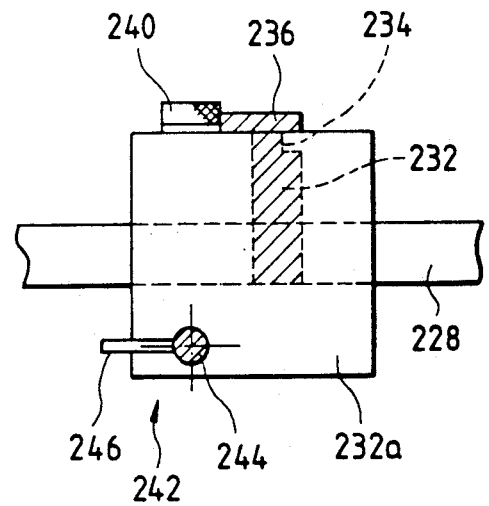

First, this positioning mechanism 242, as shown in FIG. 12, is provided for the lower x-axis guide frame 232 as viewed in the figure. In this positioning mechanism 242, as the top plan view, the front view and the side view thereof are shown in FIGS. 13A, 13B and 13C. Outside (i.e., below) and slightly below the lower x-axis guide frame 232, there is disposed a support rod 244 comprising a round bar parallel thereto. This support rod 244 has its opposite ends inserted in the opposite ends of the lower x-axis guide frame 232 and pivotally supported. Especially, this support rod 244 has its right end protruded further rightwardly from the right end portion 232a of the corresponding x-axis guide frame 232.

On the protruded end portion of the support rod 244, there is integrally mounted a pivotable lever 246 extending therefrom along the direction of the y-axis. Also, a coil spring 48 is wound on the protruded end portion of the support rod 244, and one end thereof is restrained by the right end portion 232a of the x-axis guide frame 232 and the other end thereof is restrained by the pivotable lever 246. The coil spring 248 biases the support rod 244 counterclockwise as viewed in FIG. 13C, and in the shown state, i.e., in the horizontally extending state, it has its position restrained by a stopper, not shown.

In other words, the support rod 244 is pivotally moved so as to be raised through the pivotable lever 246, whereby it is pivotally moved clockwise against the biasing force of the coil spring 248, and is resiliently returned from this pivotally moved position to the shown position by releasing the pivotable lever 246 and by the biasing force of the coil spring 248.

On the other hand, the positioning mechanism 242 is provided with a pair of pin supporting members 250 and 252 supported for movement along the x-axis through the support rod 244 and spaced apart from each other along the direction of the x-axis. That is, through-holes into which the support rod 244 is inserted are formed in these pin supporting members 250 and 252 along the x-axis. These pin supporting members 250 and 252, as shown in FIG. 14C, are constructed so as to pass right beneath the x-axis guide frame 232 and extend to the inner portion thereof.

An engagement member 254 is secured by means of a screw 256 to the upper surface portions of the pin supporting members 250 and 252 which are located outwardly of the x-axis guide frame 232. This engagement member 254 is formed so that the inner side thereof may become higher by the cross-section thereof being bent twice into the shape of a crank, and as is apparent from FIGS. 14A and 14C, the inner portion thereof is restrained in such a manner as to be in sliding contact with the upper surface of the top plate 236 secured to the upper surface of the x-axis guide frame 232. By such a construction, the pin supporting members 250 and 252 integrally slide along the x-axis while maintaining their postures relative to the x-axis guide frame 232 constant.

In that portion of the right pin supporting member 250 as viewed in the figure which is more inward than the x-axis guide frame 232, there is formed a pin guide hole 258 along the vertical direction which opens into the upper surface thereof. A movable positioning pin 260 is vertically movably inserted in the pin guide hole 258 in its upwardly protruded state. On the other hand, in the pin supporting member 250, as shown in FIGS. 14B and 14C, there is formed along the direction of the x-axis an insertion hole 262 which is in communication with the above-described pin guide hole 258. This insertion hole 262 is set so as to have a sufficient vertical length to permit the vertical stroke of the movable positioning pin 260.

Figure 14A:
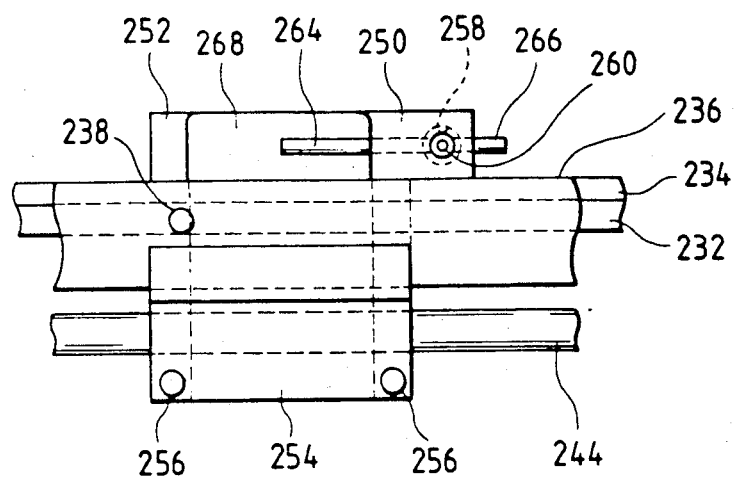
FIGS. 14A, 14B and 14C show the mounted state of a movable positioning pin in the positioning mechanism, FIG. 14A being a plan view thereof, FIG. 14B being a back view thereof, and FIG. 14C being a side view thereof.
Figure 14B:
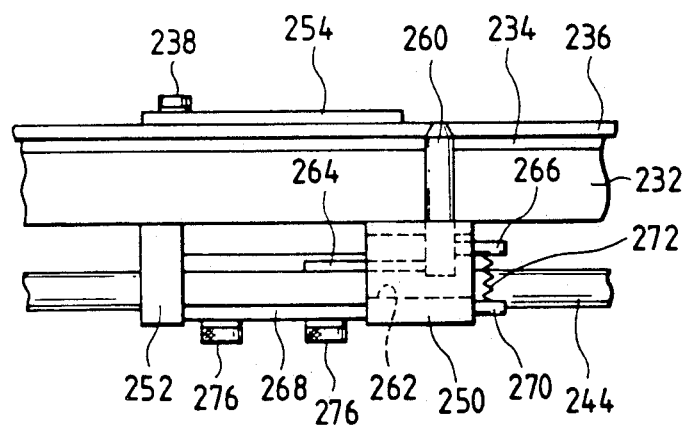
Figure 14C:
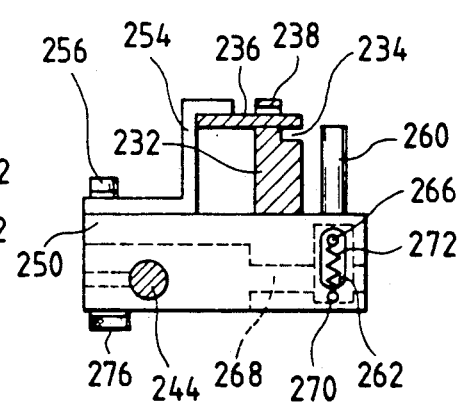

Also, as shown in FIGS. 14A and 14B, a pair of restraining pins 264 and 266 protruding to the left and right through the above-mentioned insertion hole 262 are integrally connected to that portion of the movable positioning pin 260 which is located in the pin guide hole 258. The left restraining pin 264 protrudes leftwardly from the left side of the pin supporting member 250 so as to be restrained by the upper surface of a pin raising member 268 which will be described later. The right restraining pin 266 protrudes rightwardly from the right side of the pin supporting member 250.

A third restraining pin 270 is integrally mounted on the right side of the pin supporting member 250 so as to protrude rightwardly therefrom in a state in which it is located right beneath the protruding portion of the right restraining pin 266. A coil spring 272 for biasing the right restraining pin 266 downwardly is extended between the third restraining pin 270 and the aforementioned right restraining pin 266. In this manner, the movable positioning pin 260 is normally biased downwardly by the biasing force of the coil spring 272, and the position thereof is held by the left restraining pin 264 bearing against the upper surface of the pin raising member 268. In other words, the movable positioning pin 260 is vertically moved in response to the pivotal movement of the pin raising member 268.

On the other hand, the pin raising member 268 is disposed while being sandwiched between the pair of pin supporting members 250 and 252, and is formed with an insertion hole into which the above-described support rod 244 is inserted. Thus, by the support rod 244 being inserted into this insertion hole, the pin raising member 268 is supported for pivotal movement about the support rod 244 between the pin supporting members 250 and 252. A slit 274 (shown in FIG. 15A) communicating with the above-described insertion hole is formed in the outer side of the pin raising member 268, and a securing bolt 276 is mounted vertically through this slit 274.

That is, by fastening this bolt 276, the pin raising member 268 is secured to the support rod 244 and thus becomes pivotally movable therewith and has its position with respect to the direction of the x-axis fixed. Also, by loosening the bolt 276, the pin raising member 268 becomes pivotally movable and slidable relative to the support rod 244, and this pin raising member 268 becomes slidable along the direction of the x-axis with the pair of pin supporting members 250 and 252 located on the opposite sides thereof.

Figure 15A:
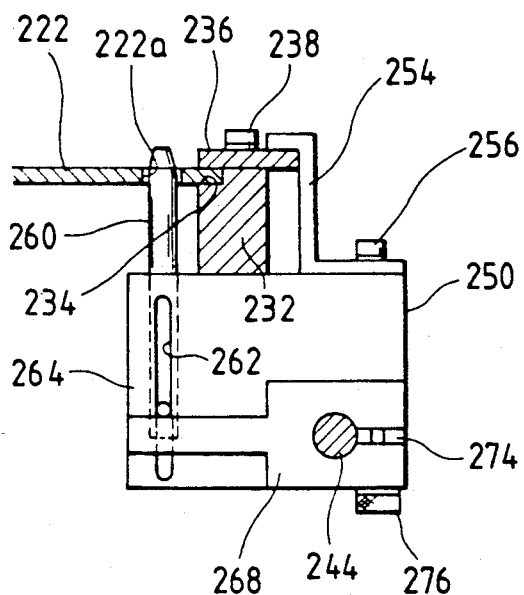
FIGS. 15A and 15B show the operation in the positioning mechanism, FIG. 15A being a side cross-sectional view showing a state in which positioning is executed, and FIG. 15B being a side cross-sectional view showing a state in which positioning is released.

The above-described support rod 244 is set so that by the pivotable lever 246 connected thereto being set in its horizontally extending state as shown in FIG. 13C, the movable positioning pin 260 is biased to its upper position as shown in FIG. 15A and fits into a positioning hole 222a formed in the base plate 222 supported on the supporting mechanism 224, thereby achieving the positioning operation.

The positioning mechanism 242 is provided with a pair of movable positioning pins 260, as shown in FIG. 12, and the foregoing description has been made only of one movable positioning pin 260. In this embodiment, however, the two movable positioning pins 260 are similar in construction and therefore, the construction of the other movable positioning pin 260 need not be described.

The positioning operation of the positioning mechanism 242 constructed as described above will now be described.

First, when prescribing the positioning position in the positioning mechanism 242, the screw 276 is loosened and the pin raising member 268 is rendered slidable relative to the support rod 244. In this state, the pin raising member 268 slides along the direction of the x-axis with the pin supporting members 250 and 252 located on the opposite sides thereof, whereby a desired positioning position is prescribed. When the positioning position is prescribed in this manner, the screw 276 is fastened and the positioning position thereof is fixed with respect to the direction of the x-axis.

Thereafter, to position the base plate 222 at this fixed position, the base plate 222 in its unpositioned state is first fitted into the groove 234 in the x-axis guide frame 232, whereby it is mounted on this x-axis guide frame 232. In this mounted state, the upper end of the movable positioning pin 260 is pushed into the lower surface of the base plate 222 and becomes depressed against the biasing force of the coil spring 248. By sliding the base plate 222 from this state in the direction of the x-axis along the groove 234, the base plate 222 is brought to a predetermined positioning position, whereby the positioning hole 222a formed in the base plate 222 and the movable positioning pin 260 vertically conform to each other and thus, the movable positioning pin 260 is fitted into the positioning hole 222a from below by the biasing force of the coil spring 248.

In this manner, the base plate 222 is accurately positioned at a preset positioning position and is reliably held at that positioning position.

Figure 15B:
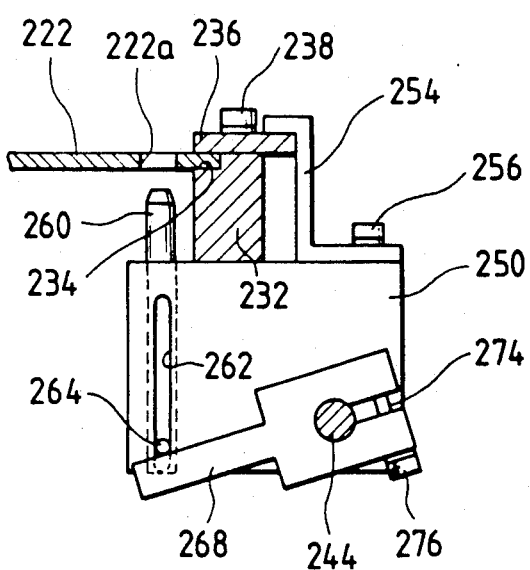
Figure 16:
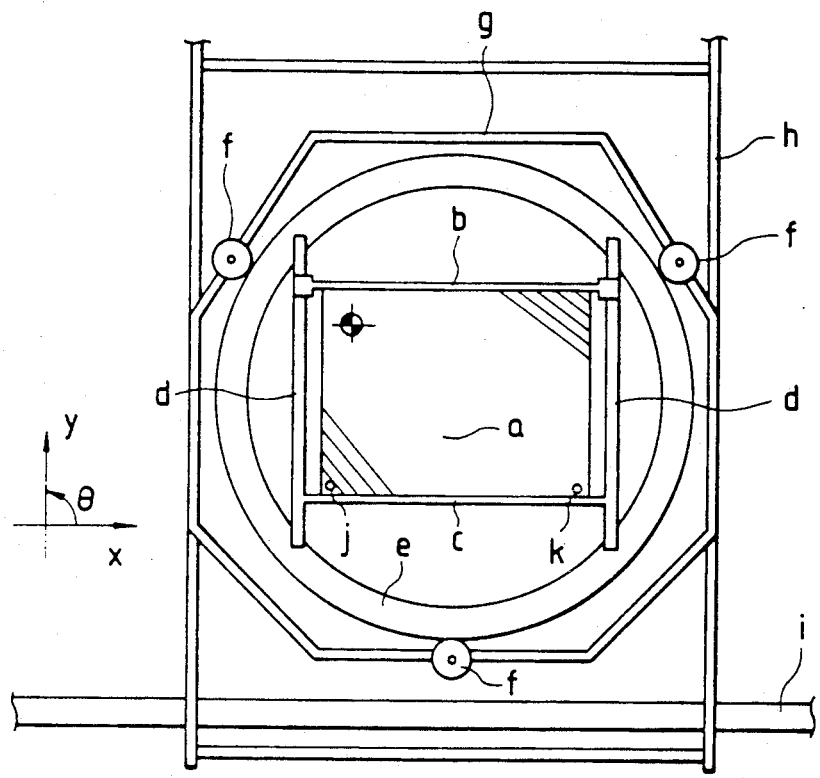
FIG. 16 is a plan view schematically showing the construction of a mounting apparatus according to the prior art.
Figure 17:
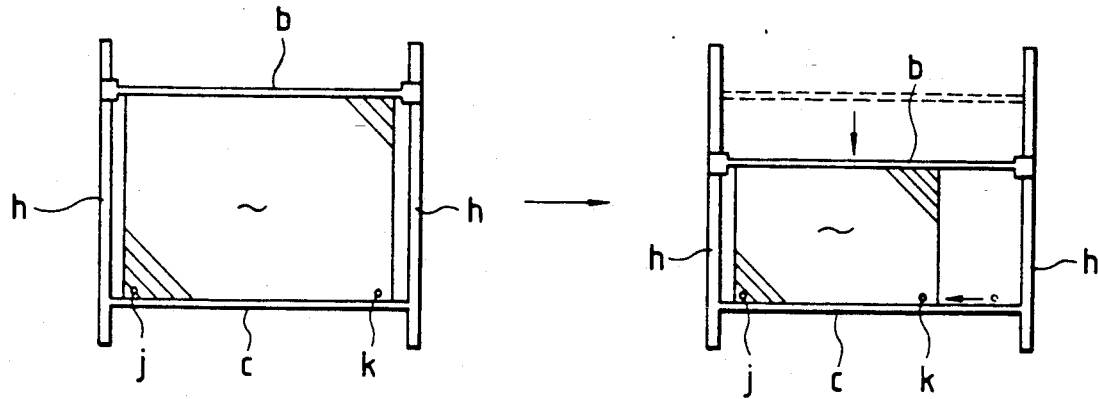
FIG. 17 is a plan view showing a base plate positioning method according to the prior art.
Figure 18:
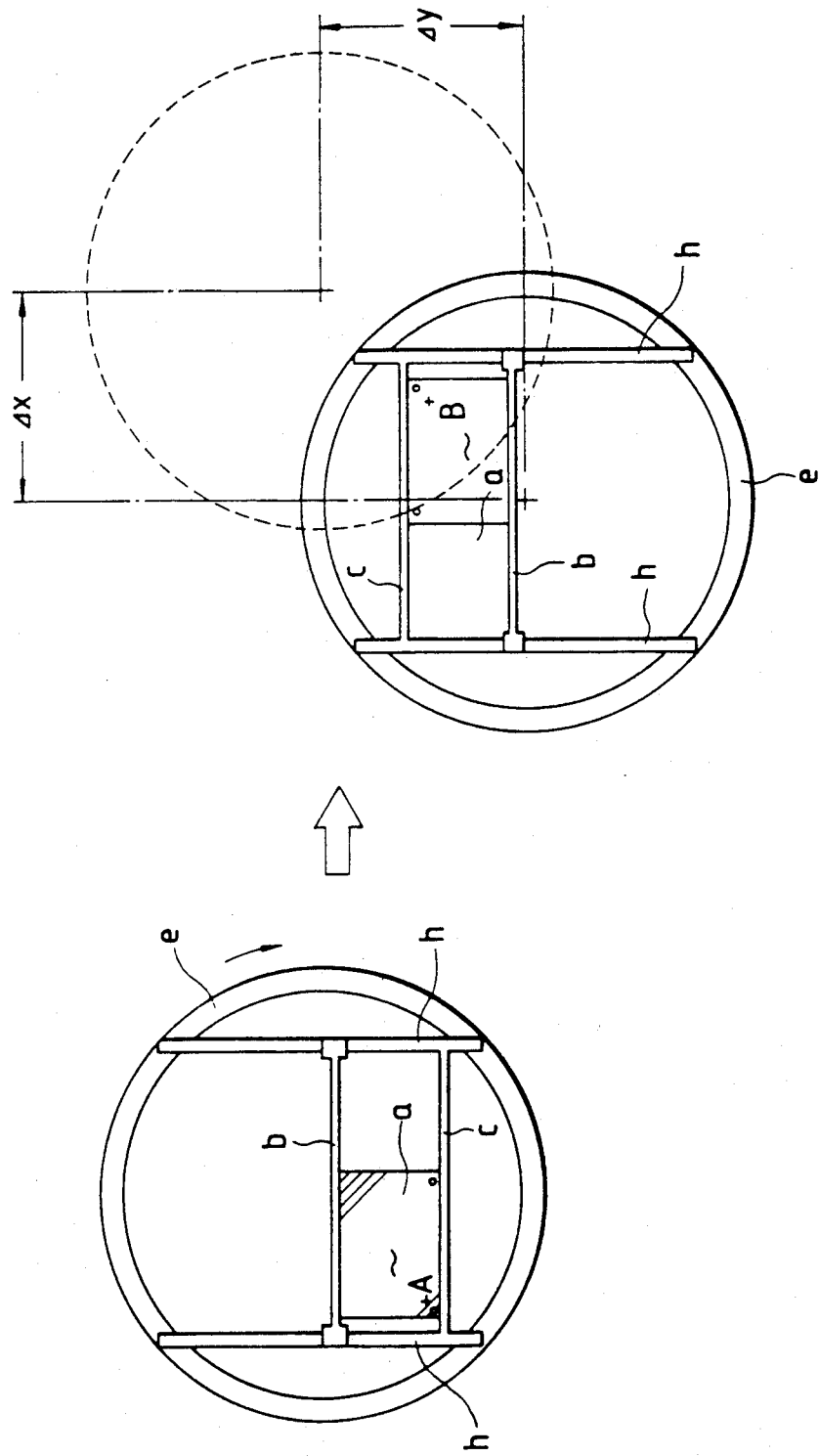
FIG. 18 is a plan view for illustrating problems peculiar to the prior art.
Figure 19A:
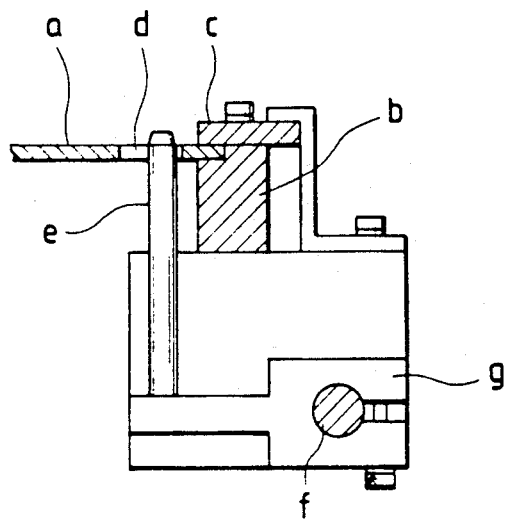
FIGS. 19A and 19B show a positioning mechanism according to the prior art, FIG. 19A being a side cross-sectional view showing a state in which positioning is executed, and FIG. 19B being a side cross-sectional view showing a state in which positioning is released.
Figure 19B:
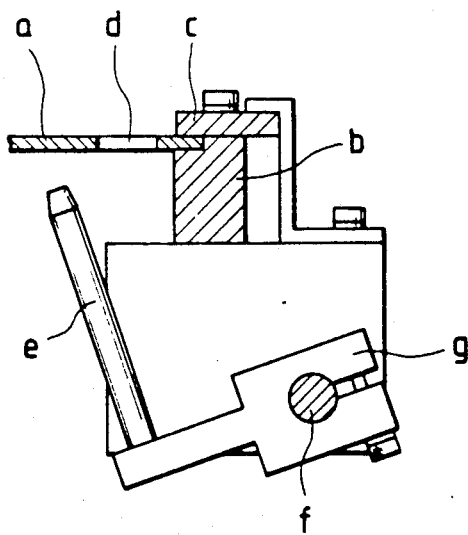

On the other hand, to release this positioned state, the pivotable lever 246 is first raised and the support rod 244 is pivotally moved clockwise as viewed in FIG. 13, i.e., counter-clockwise as viewed in FIG. 15, against the biasing force of the coil spring 248. In response to this pivotal movement, the pin raising member 268 also pivotally moves counter-clockwise as viewed in FIG. 15, and in response to this pivotal movement, the movable positioning pin 260 bearing against the upper surface thereof through the left restraining pin 264 lowers in such a manner as to maintain said bearing state, in conformity with the biasing force of the coil spring 272. In this manner, the movable positioning pin 260 shifts to the state shown in FIG. 15B, and the tip end thereof is pulled downwardly out of the positioning hole 222a in the base plate 222 and thus, the positioned state is released.

In the positioning operation and the releasing operation as described above, the movable positioning pin 260 is controlled so as to move exactly vertically along the pin guide hole 258 formed in the pin supporting member 250 so as to extend along the vertical direction. In other words, this movable positioning pin 260 is controlled so as to move exactly vertically.

As a result, in this embodiment, the size of the positioning hole 222a formed in the base plate 222 may be simply set so as to have a sufficient clearance to receive the movable positioning pin 260 inserted therein from right below, and in this manner, it becomes possible to set this clearance to a minimum. Thus, according to this embodiment, the base plate 222 positioned by the movable positioning pin 260 has its positioning position prescribed very accurately without any backlash.

As described above in detail, in this embodiment, design is made such that in conformity with the location at which the positioning hole 222a in a base plate 222 of different size is formed, the movable positioning pin 260 can be moved back and forth along the vertical direction at any position and therefore, even if a pressing mechanism for pressing the marginal edge of the positioning hole 222a against the movable positioning pin 260 is eliminated, the base plate 222 can be accurately positioned at a predetermined position.

As described above in detail, the mounting apparatus according to the present invention is provided with a support table on which a base plate on which electronic parts or the like are mounted is supported and which is movable to any position in the x-y plane and is supported for rotation to any rotated position, a pair of movable guide members provided for movement on said support table along one of the x-axis and the y-axis and guiding the end edge of said base plate along the other axis so as to sandwich it from the opposite sides thereof, and positioning means mounted on one of said pair of movable guide members for movement along the other axis, said positioning means being provided with a positioning pin vertically movably supported by said one movable guide member and biased upwardly to thereby fit from below into a positioning hole formed in said base plate mounted on said movable guide members and position said base plate, a support rod adjacent to said on movable guide member and extending along said other axis and supported for pivotal movement about its own center axis, a pin supporting member into which said support rod is pivotably inserted and which is supported for sliding movement along said other axis relative to said one guide member and into which said positioning pin is vertically movably inserted, and a pin engaging member which is removably secured to said support rod and with which said positioning pin is engaged, whereby said positioning pin is vertically moved in response to the pivotal movement of said support rod.

Thus, according to the present invention, there is provided a mounting apparatus which can position base plates of various sizes highly accurately by a simple construction.

What is claimed is:

1. A part mounting apparatus comprising:
a base plate on which parts to be mounted are placed;
a support table on which said base plate is supported and which is movable to any position in an x-y plane and is supported for rotation to any rotated position;
a pair of movable guide members provided for movement on said support table along one of the x-axis and the y-axis and for guiding the end edge of said base plate along the other axis so as to sandwich it from the opposite sides thereof;
a rotary table for supporting said base plate thereon;
moving means for moving said rotary table in the direction of at least one of the x-axis and the y-axis;
means for holding said base plate on said rotary table, said holding means comprising size regulating means for regulating the holding position in conformity with the size of said base plate;
a motor for rotatively driving said rotary table;
friction driving means for transmitting the drive force of said motor to said rotary table, wherein said friction driving means is held on said moving means; and
positioning means mounted on one of said pair of movable guide members for movement along the other axis, said positioning means comprising:
a positioning pin vertically movable supported by said one movable guide member and biased upwardly to thereby fit from below into a positioning hole formed in said base plate mounted on said movable guide members and to position said base plate;
a support rod adjacent to said one movable guide member and extending along said other axis and supported for pivotal movement about its own center axis;
a pin supporting member into which said support rod is pivotably inserted and which is supported for sliding movement along said other axis relative to said one guide member and into which said positioning pin is vertically movably inserted; and
a pin engaging member which is removably secured to said support rod and with which said positioning pin is engaged, whereby said positioning pin is vertically moved in response to the pivotal movement of said support rod.

2. A part mounting apparatus according to claim 1, wherein said friction driving means comprises:
a rotary ring for supporting said base plate on said rotary table;
a driving roller and a follower roller disposed on the inner periphery and the outer periphery, respectively, of said rotary ring and nipping said ring therebetween and connected to said motor; and
pressing force regulating means capable of pressing said driving roller and regulating the pressure contact force between said driving roller and said ring.

3. A part mounting apparatus according to claim 1, further comprising means for bringing the center of said base plate into coincidence with the center of rotation of said rotary table.

* * * * *

UNITED STATES PATENT AND TRADEMARK OFFICE
CERTIFICATE OF CORRECTION

PATENT NO. : 5,117,761

DATED : June 2, 1992

INVENTOR(S) : Shozo Kasai, et al.

Page 1 of 2

It is certified that error appears in the above-identified patent and that said Letters Patent is hereby corrected as shown below:

COLUMN 2

Line 21, "reference character q" should read --reference character g--; and
Line 60, "by" should read --by a positioning pin e--.

COLUMN 3

Line 1, "q" should read --g--.

COLUMN 4

Line 55, "mechanism 10" should read --mechanism 10,--; and
Line 56, "mounted" should read --mounted, is mounted,--.

COLUMN 5

Line 25, on" should read --one--.

COLUMN 8

Line 58 "accumulated" should read --accumulate--.

COLUMN 9

Line 34, "target," should read --target--; and
Line 47, "Circuit" should read --circuit--.

UNITED STATES PATENT AND TRADEMARK OFFICE
CERTIFICATE OF CORRECTION

PATENT NO. : 5,117,761

DATED : June 2, 1992

INVENTOR(S) : Shozo Kasai, et al.

It is certified that error appears in the above-identified patent and that said Letters Patent is hereby corrected as shown below:

COLUMN 14

Line 18, "ar" should read --are--.

COLUMN 15

Line 58, "coil spring 48" should read --coil spring 248--.

Signed and Sealed this

Third Day of August, 1993

Attest:

MICHAEL K. KIRK

Attesting Officer

Acting Commissioner of Patents and Trademarks